United States Patent
Orihara et al.

(10) Patent No.: US 9,507,254 B2
(45) Date of Patent: Nov. 29, 2016

(54) METHOD OF MANUFACTURING SUBSTRATE WITH A MULTILAYER REFLECTIVE FILM, METHOD OF MANUFACTURING A REFLECTIVE MASK BLANK, SUBSTRATE WITH A MULTILAYER REFLECTIVE FILM, REFLECTIVE MASK BLANK, REFLECTIVE MASK AND METHOD OF MANUFACTURING A SEMICONDUCTOR DEVICE

(71) Applicant: HOYA CORPORATION, Tokyo (JP)

(72) Inventors: Toshihiko Orihara, Tokyo (JP); Kazuhiro Hamamoto, Tokyo (JP); Hirofumi Kozakai, Tokyo (JP); Tsutomu Shoki, Tokyo (JP); Junichi Horikawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 71 days.

(21) Appl. No.: 14/423,494

(22) PCT Filed: Sep. 24, 2013

(86) PCT No.: PCT/JP2013/075754
§ 371 (c)(1),
(2) Date: Feb. 24, 2015

(87) PCT Pub. No.: WO2014/050831
PCT Pub. Date: Apr. 3, 2014

(65) Prior Publication Data
US 2015/0205196 A1 Jul. 23, 2015

(30) Foreign Application Priority Data

Sep. 28, 2012 (JP) .................................. 2012-216525

(51) Int. Cl.
*G03F 1/22* (2012.01)
*G03F 1/50* (2012.01)
(Continued)

(52) U.S. Cl.
CPC . *G03F 1/76* (2013.01); *G03F 1/24* (2013.01); *G03F 1/52* (2013.01); *G03F 1/68* (2013.01); *G03F 7/20* (2013.01); *H01L 21/0274* (2013.01)

(58) Field of Classification Search
None
See application file for complete search history.

(56) References Cited

U.S. PATENT DOCUMENTS

2004/0159538 A1 8/2004 Becker et al.
2004/0175633 A1 9/2004 Shoki et al.
(Continued)

FOREIGN PATENT DOCUMENTS

JP 2004-246366 A 9/2004
JP 2004-289110 A 10/2004
(Continued)

OTHER PUBLICATIONS

International Search Report for PCT/JP2013/075754 dated Nov. 19, 2013 [PCT/ISA.210].
(Continued)

*Primary Examiner* — Stephen Rosasco
(74) *Attorney, Agent, or Firm* — Sughrue Mion, PLLC

(57) ABSTRACT

An object of the present invention is to provide a substrate with a multilayer reflective film that enables the number of detected pseudo defects, to be reduced even when using highly sensitive defect inspection apparatuses using light of various wavelengths, and in particular, is capable of achieving a level of smoothness required of substrates with a multilayer reflective film while reliably detecting critical defects as a result of reducing the number of detected pseudo defects, as well as a method of manufacturing the same.
The present invention relates to a method of manufacturing a substrate with a multilayer reflective film having a multilayer reflective film, obtained by alternately laminating a high refractive index layer and a low refractive index layer, on the main surface of a mask blank substrate on the side of which a transfer pattern is formed, comprising a step of: depositing the multilayer reflective film on the main surface by ion beam sputtering using targets composed of a high refractive index material and a low refractive index material; wherein, during the ion beam sputtering, sputtered particles of the high refractive index material and the low refractive index material are made to enter at prescribed incident angle relative to the normal of the main surface so that the power spectral density in a prescribed spatial frequency region is a prescribed value.

17 Claims, 5 Drawing Sheets

(51) Int. Cl.
   *G03F 1/76*  (2012.01)
   *G03F 1/24*  (2012.01)
   *G03F 1/68*  (2012.01)
   *G03F 1/52*  (2012.01)
   *G03F 7/20*  (2006.01)
   *H01L 21/027* (2006.01)

(56) References Cited

U.S. PATENT DOCUMENTS

2007/0077499 A1   4/2007  Ikuta et al.
2011/0059391 A1*  3/2011  Shoki ............... B82Y 10/00
                                                430/5

2011/0171568 A1   7/2011  Sasaki et al.

FOREIGN PATENT DOCUMENTS

| JP | 2007-073949 A | 3/2007 |
| JP | 2009-510711 A | 3/2009 |
| JP | 2009-272317 A | 11/2009 |
| WO | 2010061828 A1 | 6/2010 |

OTHER PUBLICATIONS

Written Opinion for PCT/JP2013/075754 dated Nov. 19, 2013 [PCT/ISA.237].

* cited by examiner (a)

(b)

METHOD OF MANUFACTURING SUBSTRATE WITH A MULTILAYER REFLECTIVE FILM, METHOD OF MANUFACTURING A REFLECTIVE MASK BLANK, SUBSTRATE WITH A MULTILAYER REFLECTIVE FILM, REFLECTIVE MASK BLANK, REFLECTIVE MASK AND METHOD OF MANUFACTURING A SEMICONDUCTOR DEVICE

CROSS REFERENCE TO RELATED APPLICATIONS

This application is a National Stage of International Application No. PCT/JP2013/075754 filed Sep. 24, 2013, claiming priority based on Japanese Patent Application No. 2012-216525 filed Sep. 28, 2012, the contents of all of which are incorporated herein by reference in their entirety.

TECHNICAL FIELD

The present invention relates to a substrate with a multilayer reflective film, which suppresses detection of pseudo defects caused by surface roughness of a multilayer reflective film and facilitates the discovery of contaminants or scratches and other critical defects in defect inspections using highly sensitive defect inspection apparatuses, and a method of manufacturing the same, a reflective mask blank obtained from the substrate and a method of manufacturing the same, a reflective mask obtained from the mask blank and a method of manufacturing the same, and a method of manufacturing a semiconductor device using the reflective mask.

BACKGROUND ART

Accompanying the increasingly higher levels of integration of semiconductor devices in the semiconductor industry in recent years, there is a growing need for fine patterns that exceed the transfer limitations of conventional photolithography methods using ultraviolet light. Extreme ultraviolet (EUV) lithography is considered to be promising as an exposure technology that uses EUV light to enable the formation of such fine patterns. Here, EUV light refers to light in the soft X-ray region or vacuum ultraviolet region, and more specifically, light having a wavelength of about 0.2 nm to 100 nm. Reflective masks have been proposed as transfer masks for use in this EUV lithography. Such reflective masks have a multilayer reflective film that reflects exposure light formed on a substrate, and an absorber film that absorbs exposure light is formed in a pattern shape on the multilayer reflective film.

The reflective mask is manufactured from a reflective mask blank having a substrate, a multilayer reflective film formed on the substrate, and an absorber film formed on the multilayer reflective film, by forming an absorber film pattern by photolithography and the like.

As has been described above, due to the growing demand for miniaturization in the lithography process, significant problems are being encountered in the lithography process. One of these is the problem relating to defect information of substrates with a multilayer reflective film used in the lithography process.

Substrates with a multilayer reflective film are being required to have even higher smoothness from the viewpoints of improving defect quality accompanying the miniaturization of patterns in recent years and the optical properties required of transfer masks. The multilayer reflective film is formed by alternately laminating a high refractive index layer and a low refractive index layer on the surface of a mask blank substrate. Each of these layers is typically formed by sputtering using sputtering targets composed of the materials that form these layers.

Ion beam sputtering is preferably carried out as a sputtering technique from the viewpoints of the multilayer reflective film being resistant to contamination by impurities since there is no need to form plasma by electrical discharge, and the comparative ease with which conditions can be set due to the use of an independent ion source, while from the viewpoints of smoothness and surface uniformity of each of the layers formed, a high refractive index layer and a low refractive index layer are deposited by allowing sputtered particles to reach the substrate at a large angle relative to the normal of the main surface of the mask blank substrate (line vertical to the main surface), or in other words, at an angle that is diagonal or nearly parallel to the main surface of the substrate.

Patent Literature 1 describes an example of a technology for manufacturing a substrate with a multilayer reflective film using this type of method wherein, when depositing a multilayer reflective film of a reflective mask blank for EUV lithography on a substrate, ion beam sputtering is carried out by maintaining the absolute value of an angle α formed between the normal of the substrate and sputtered particles entering the substrate such that $35 \text{ degrees} \leq \alpha \leq 80 \text{ degrees}$ while rotating the substrate around its central axis.

PRIOR ART LITERATURE

Patent Literature

Patent Literature 1: Japanese Unexamined Patent Application Publication (Translation of PCT Application) No. 2009-510711

DISCLOSURE OF THE INVENTION

Problems to be Solved by the Invention

Accompanying the rapid pace of pattern miniaturization in lithography using ArF excimer lasers and EUV light, the defect size of binary masks, phase-shifting masks and other types of transparent masks (also referred to as optical masks), as well as EUV masks that are reflective masks, is becoming increasingly small year by year, and the inspection light source wavelengths used during defect inspections are approaching the light source wavelength of the exposure light in order to detect such fine defects.

For example, highly sensitive defect inspection apparatuses having an inspection light source wavelength of 193 nm are being used increasingly frequently as defect inspection apparatuses of optical masks, EUV mask blanks that are masters thereof and substrates, while highly sensitive defect inspection apparatuses having an inspection light source wavelength of 266 nm (MAGICS 7360 Mask Substrate/Blank Defect Inspection Apparatus for EUV Exposure manufactured by Lasertec Corp.), 193 nm (Teron 600 Series of EUV Mask/Blank Defect Inspection Apparatuses manufactured by KLA-Tencor Corp.), or 13.5 nm are being used increasingly frequently or are being proposed for use as defect inspection apparatuses of EUV masks, EUV mask blanks that are masters thereof and substrates.

Here, the multilayer reflective films of substrates with a multilayer reflective film used in conventional transfer masks are deposited, for example, using the method described in the section entitled "Background Art" in an attempt to reduce concave defects present on the substrate. However, regardless of the degree to which defects attributable to concave defects of the substrate are able to be reduced, due to the high detection sensitivity of the aforementioned highly sensitive defect inspection apparatuses, the problem occurs in which an excessively large number of defects are detected (number of detected defects=critical defects+pseudo defects) when multilayer reflective films are inspected for defects.

Pseudo defects as mentioned here refer to surface irregularities that are permitted to be present on a multilayer reflective film and do not have an effect on pattern transfer, and end up being incorrectly assessed as defects in the case of having inspected the film with a highly sensitive defect inspection apparatus. If an excessively large number of such pseudo defects are detected in a defect inspection, critical defects that have an effect on pattern transfer end up being concealed in the large number of pseudo defects, thereby preventing critical defects from being discovered. For example, in the case of currently popular defect inspection apparatuses having an inspection light source wavelength of 266 nm, 193 nm or 13.5 nm, more than 100,000 defects end up being detected in a substrate with a multilayer reflective film having a size of 132 mm×132 mm, thereby preventing the substrate from being inspected for the presence of critical defects. Overlooking critical defects in a defect inspection results in defective quality in the subsequent semiconductor device mass production process and leads to unnecessary labor and economic loss.

Therefore, an object of the present invention is to provide a substrate with a multilayer reflective film that enables the number of detected defects, including pseudo defects, to be reduced even when using highly sensitive defect inspection apparatuses using light of various wavelengths, and in particular, is capable of achieving a level of smoothness required of substrates with a multilayer reflective film while reliably detecting critical defects as a result of reducing the number of detected defects, including pseudo defects, as well as a manufacturing method thereof, a reflective mask blank obtained by using that substrate and a manufacturing method thereof, a reflective mask and a manufacturing method thereof, and a method of manufacturing a semiconductor device that uses the aforementioned reflective mask.

Means for Solving the Problems

Although efforts to reduce the surface roughness of multilayer reflective films have conventionally been made from the viewpoint of the reflectance properties thereof, there are no such efforts known whatsoever with respect to the correlation with detection of pseudo defects by highly sensitive defect inspection apparatuses.

As a result of conducting extensive studies to solve the aforementioned problems, the inventors of the present invention found that the roughness of a prescribed spatial frequency (or spatial wavelength) component with respect to the inspection light source wavelength of a highly sensitive defect inspection apparatus is easily detected as a pseudo defect. For this reason, pseudo defects can be suppressed from being detected and critical defects can be made to be more conspicuous in defect inspections by specifying the spatial frequency of the roughness component among the roughness (surface irregularity) components of a multilayer reflective film that is incorrectly assessed as a pseudo defect by a highly sensitive defect inspection apparatus, and controlling amplitude intensity (power spectral density) at that spatial frequency.

The inventors of the present invention then have found it is possible to control power spectral density in the multilayer reflective film according to the deposition conditions of the multilayer reflective film, and further found that, by these deposition conditions, the background level (BGL) during defect inspections using highly sensitive defect inspection apparatuses having an inspection light source wavelength of 13.5 nm can be lowered to suppress detection of pseudo defects, thereby leading to completion of the present invention.

Namely, the present invention has the configurations indicated below.

(Configuration 1)

Configuration 1 of the present invention is a method of manufacturing a substrate with a multilayer reflective film having a multilayer reflective film, obtained by alternately laminating a high refractive index layer and a low refractive index layer, on the main surface of a mask blank substrate on the side of which a transfer pattern is formed, comprising a step of: depositing the multilayer reflective film on the main surface by ion beam sputtering using targets composed of a high refractive index material and a low refractive index material; wherein, during the ion beam sputtering, sputtered particles of the high refractive index material and the low refractive index material are made to enter at prescribed incident angle relative to the normal of the substrate main surface so that the power spectral density at a spatial frequency of 1 $\mu m^{-1}$ to 10 $\mu m^{-1}$, obtained by measuring a 1 $\mu m \times 1$ $\mu m$ region on the surface of the multilayer reflective film with an atomic force microscope, is not more than 20 $nm^4$, and power spectral density at a spatial frequency of 10 $\mu m^{-1}$ to 100 $\mu m^{-1}$ is not more than 10 $nm^4$.

According to the aforementioned Configuration 1, by forming a multilayer reflective film on a mask blank substrate by ion beam sputtering, and setting the incident angle of sputtered particles of layer-forming materials during that ion beam sputtering so that the power spectral density at a spatial frequency of 1 $\mu m^{-1}$ to 10 $\mu m^{-1}$, obtained by measuring a 1 $\mu m \times 1$ $\mu m$ region on the surface of the multilayer reflective film with an atomic force microscope, is not more than 20 $nm^4$, and power spectral density at a spatial frequency of 10 $\mu m^{-1}$ to 100 $\mu m^{-1}$ is not more than 10 $nm^4$, the number of defects, including pseudo defects, detected in a defect inspection carried out using a highly sensitive defect inspection apparatus that uses a UV laser having a wavelength of 266 nm, ArF excimer laser having a wavelength of 193 nm or EUV light having a wavelength of 13.5 nm, can be suppressed, thereby making it possible to make critical defects more conspicuous.

(Configuration 2)

Configuration 2 of the present invention is the method of manufacturing a substrate with a multilayer reflective film described in Configuration 1 wherein the incident angle is 0 degree to 30 degrees relative to the normal of the main surface.

According to the aforementioned Configuration 2, as a result of setting the aforementioned incident angle at 0 degree to 30 degrees relative to the normal of the main surface, the aforementioned power spectral density can be made to be within a preferable range, and the number of defects, including pseudo defects, detected in defect inspections using various highly sensitive defect inspection apparatuses can be suppressed, thereby making it possible to make critical defects more conspicuous.

(Configuration 3)

Configuration 3 of the present invention is the method of manufacturing a substrate with a multilayer reflective film described in Configuration 1 or 2, further comprising a step of forming a protective film on the multilayer reflective film, wherein the power spectral density at a spatial frequency of 1 µm$^{-1}$ to 10 µm$^{-1}$, obtained by measuring a 1 µm×1 µm region on the surface of the protective film with an atomic force microscope, is not more than 20 nm$^4$, and power spectral density at a spatial frequency of 10 µm$^{-1}$ to 100 µm$^{-1}$ is not more than 10 nm$^4$.

According to the aforementioned Configuration 3, as a result of forming a protective film on the multilayer reflective film, damage to the surface of the multilayer reflective film when manufacturing a transfer mask (EUV mask) can be inhibited, thereby resulting in more favorable reflectance properties of the multilayer reflective film with respect to EUV light. In addition, as a result of controlling the power spectral density of the protective film to be within a fixed range, the number of defects, including pseudo defects, detected in a defect inspection of the surface of the protective film using, for example, a highly sensitive defect inspection apparatus that uses light having a wavelength of 266 nm, 193 nm or 13.5 nm for the inspection light source wavelength can be significantly suppressed and critical defects can be made to be more conspicuous.

(Configuration 4)

Configuration 4 of the present invention is the method of manufacturing a substrate with a multilayer reflective film described in any of Configurations 1 to 3, wherein the power spectral density at a spatial frequency of 1 µm$^{-1}$ to 10 µm$^{-1}$, obtained by measuring a 1 µm×1 µm region on the main surface of the mask blank substrate on the side of which the transfer pattern is formed with an atomic force microscope, is not more than 10 nm$^4$.

According to the aforementioned Configuration 4, as a result of controlling the power spectral density of the main surface of a mask blank substrate on the side of which a transfer pattern is formed to be within a fixed range, smoothness of the multilayer reflective film can be further enhanced and the number of defects, including pseudo defects, detected can be greatly suppressed.

(Configuration 5)

Configuration 5 of the present invention is the method of manufacturing a substrate with a multilayer reflective film described in Configuration 4, wherein the surface of the mask blank substrate is processed by elastic emission machining (EEM) and/or catalyst-referred etching (CARE).

According to the aforementioned Configuration 5, as a result of processing the surface of the mask blank substrate by either or both of EEM and CARE, the range of the aforementioned power spectral density can be preferably achieved.

(Configuration 6)

Configuration 6 of the present invention is a method of manufacturing a reflective mask blank, comprising: forming an absorber film to serve as a transfer pattern on a multilayer reflective film or protective film of a substrate with a multilayer reflective film manufactured according to the method of manufacturing a substrate with a multilayer reflective film described in any of Configurations 1 to 5.

According to the aforementioned Configuration 6, the number of defects, including pseudo defects, detected in a reflective mask blank in a defect inspection using a highly sensitive defect inspection apparatus that uses light having a wavelength of 266 nm, 193 nm or 13.5 nm for the inspection light source wavelength can be suppressed and critical defects can be made to be more conspicuous.

(Configuration 7)

Configuration 7 of the present invention is a method of manufacturing a reflective mask, comprising: forming an absorber pattern on the multilayer reflective film or the protective film by patterning an absorber film in a reflective mask blank manufactured according to the method of manufacturing a reflective mask blank described in Configuration 6.

According to the aforementioned Configuration 7, the number of defects, including pseudo defects, detected in a reflective mask in a defect inspection using a highly sensitive defect inspection apparatus can be suppressed and critical defects can be made to be more conspicuous.

(Configuration 8)

Configuration 8 of the present invention is a substrate with a multilayer reflective film having a multilayer reflective film obtained by alternately laminating a high refractive index layer and a low refractive index layer on the main surface of a mask blank substrate on the side of which a transfer pattern is formed; wherein, the film surface of the substrate with a multilayer reflective film is such that the power spectral density at a spatial frequency of 1 µm$^{-1}$ to 10 µm$^{-1}$, obtained by measuring a 1 µm×1 µm region with an atomic force microscope, is not more than 20 nm$^4$, power spectral density at a spatial frequency of 10 µm$^{-1}$ to 100 µm$^{-1}$ is not more than 10 nm$^4$, and surface roughness of the film surface at a spatial frequency of 10 µm$^{-1}$ to 100 µm$^{-1}$ is less than 0.13 nm in terms of the root mean square roughness (Rms).

According to the aforementioned Configuration 8, as a result of setting the power spectral density at a spatial frequency of 1 µm$^{-1}$ to 10 µm$^{-1}$, obtained by measuring a 1 µm×1 µm region of the film surface of the substrate with a multilayer reflective film with an atomic force microscope, at not more than 20 nm$^4$, setting the power spectral density at a spatial frequency of 10 µm$^{-1}$ to 100 µm$^{-1}$ at not more than 10 nm$^4$, and setting the surface roughness of the film surface at a spatial frequency of 10 µm$^{-1}$ to 100 µm$^{-1}$ at less than 0.13 nm in terms of the root mean square roughness (Rms), the number of defects, including pseudo defects, detected in a defect inspection using a highly sensitive defect inspection apparatus that uses a UV laser having a wavelength of 266 nm, ArF excimer laser having a wavelength of 193 nm or EUV light having a wavelength of 13.5 nm can be suppressed while maintaining the reflectance properties of the multilayer reflective film in a high state with respect to EUV light, thereby making it possible to make critical defects more conspicuous.

(Configuration 9)

Configuration 9 of the present invention is the substrate with a multilayer reflective film described in Configuration 8, wherein the substrate with a multilayer reflective film has a protective film on the multilayer reflective film, the power spectral density at a spatial frequency of 1 µm$^{-1}$ to 10 µm$^{-1}$, obtained by measuring a 1 µm×1 µm region of the protective film surface with an atomic force microscope, is not more than 20 nm$^4$, power spectral density at a spatial frequency of 10 µm$^{-1}$ to 100 µm$^{-1}$ is not more than 10 nm$^4$, and surface roughness of the protective film surface at a spatial frequency of 10 µm$^{-1}$ to 100 µm$^{-1}$ is less than 0.13 nm in terms of the root mean square roughness (Rms).

According to the aforementioned Configuration 9, as a result of having a protective film on the multilayer reflective film, damage to the surface of the multilayer reflective film when manufacturing a transfer mask (EUV mask) can be inhibited, thereby resulting in more favorable reflectance properties of the multilayer reflective film with respect to EUV light. In addition, as a result of controlling the power spectral density of the protective film to be within a fixed range, the number of defects, including pseudo defects, detected in a defect inspection of the surface of the protective film using, for example, a highly sensitive defect inspection apparatus that uses light having a wavelength of 266 nm, 193 nm or 13.5 nm for the inspection light source wavelength can be significantly suppressed and critical defects can be made to be more conspicuous.

(Configuration 10)

Configuration 10 of the present invention is a reflective mask blank having an absorber film to serve as a transfer pattern on a multilayer reflective film or protective film of the substrate with a multilayer reflective film described in Configuration 8 or 9.

According to the aforementioned Configuration 10, the number of defects, including pseudo defects, detected in a reflective mask blank in a defect inspection using a highly sensitive defect inspection apparatus that uses light having a wavelength of 266 nm, 193 nm or 13.5 nm for the inspection light source wavelength can be suppressed and critical defects can be made to be more conspicuous.

(Configuration 11)

Configuration 11 of the present invention is a reflective mask having an absorber pattern on the multilayer reflective film or the protective film that is obtained by patterning an absorber film in the reflective mask blank described in Configuration 10.

According to the aforementioned Configuration 11, the number of defects, including pseudo defects, in a reflective mask in a defect inspection using a highly sensitive defect inspection apparatus can be suppressed and critical defects can be made to be more conspicuous.

(Configuration 12)

Configuration 12 of the present invention is a method of manufacturing a semiconductor device, comprising a step of forming a transfer pattern on a workpiece by carrying out a lithography process that uses an exposure apparatus using the reflective mask described in Configuration 11.

According to the aforementioned Configuration 12, a reflective mask from which contaminants, scratches and other critical defects have been removed can be used in a defect inspection using a highly sensitive defect inspection apparatus, the number of defects, including pseudo defects, detected in the inspection are greatly suppressed, and unnecessary costs are reduced. For this reason, in a resist film formed on a workpiece such as a semiconductor substrate, a transfer pattern such as a circuit pattern that is transferred using the aforementioned mask is free of defects, and a semiconductor device having a fine and highly precise transfer pattern can be economically and advantageously manufactured.

Effects of the Invention

According to the present invention, a substrate with a multilayer reflective film, and a manufacturing method thereof, are provided that enable the number of detected pseudo defects to be reduced even when using highly sensitive defect inspection apparatuses using light of various wavelengths, and in particular, are capable of achieving high levels of flatness and smoothness required of substrates with a multilayer reflective film while simultaneously reliably detecting critical defects as a result of reducing the number of detected defects, including pseudo defects. Moreover, a reflective mask blank obtained by using that substrate and a manufacturing method thereof, a reflective mask and a manufacturing method thereof, and a method of manufacturing a semiconductor device that uses the reflective mask, are also provided.

BEST MODE FOR CARRYING OUT THE INVENTION

[Method of Manufacturing Substrate with Multilayer Reflective Film]

Figure 1:
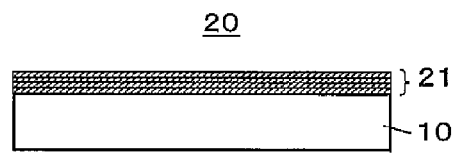
FIG. 1 is cross-sectional schematic diagram showing one example of the configuration of a substrate with a multilayer reflective film according to one embodiment of the present invention.

First, an explanation is provided of a method of manufacturing a substrate with a multilayer reflective film 20 according to one embodiment of the present invention below. FIG. 1 is a schematic diagram showing the substrate with a multilayer reflective film 20 of the present embodiment.

The substrate with a multilayer reflective film 20 of the present embodiment is manufactured by forming a multilayer reflective film 21 on the main surface of a mask blank substrate 10 on the side of which a transfer pattern is formed. This multilayer reflective film 21 imparts a function of reflecting light to a reflective mask for lithography, and adopts the configuration of a multilayer film obtained by periodically laminating elements having different refractive indices. In the substrate with a multilayer reflective film 20 of the present invention, the number of defects, including pseudo defects, detected is suppressed even in an inspection using a defect inspection apparatus that uses light of an extremely short wavelength of 13.5 nm as previously described. Consequently, the substrate with a multilayer reflective film 20 is preferable for EUV lithography which may require the use of EUV light having a wavelength of 13.5 nm in a defect inspection.

Although there are no particular limitations on the material of the multilayer reflective film 21 provided it reflects light, particularly EUV light, the reflectance thereof when present alone is normally not less than 65% and the upper limit is normally 73%. This type of multilayer reflective film 21 can typically employ a configuration in which a thin film composed of a high refractive index material (high refractive index layer) and a thin film composed of a low refractive index material (low refractive index layer) are alternately laminated for about 40 to 60 cycles.

For example, an Mo/Si periodic laminate film, obtained by alternately laminating 40 cycles of an Mo film and an Si film is preferable for use as the multilayer reflective film 21 with respect to EUV light having a wavelength of 13 nm to 14 nm. Other examples of multilayer reflective films used in the region of EUV light include Ru/Si periodic multilayer film, Mo/Be periodic multilayer film, Mo compound/Si compound periodic multilayer film, Si/Nb periodic multilayer film, Si/Mo/Ru periodic multilayer film, Si/Mo/Ru/Mo periodic multilayer film and Si/Ru/Mo/Ru periodic multilayer film.

Conventionally, magnetron sputtering or ion beam sputtering has been used to form the multilayer reflective film. In the present invention, ion beam sputtering is employed to form the multilayer reflective film 21, a high refractive index material and a low refractive index material are used for the targets, and sputtered particles thereof are made to enter at a prescribed incident angle relative to the normal of the main surface of the mask blank substrate 10 on the side of which a transfer pattern is formed.

Specifically, the sputtered particles are made to enter at an incident angle so that power spectral density (PSD) on the film surface of the multilayer reflective film 21 in a specific spatial frequency region is within a specific range. Furthermore, the film surface of the multilayer reflective film 21 refers to the surface of the uppermost layer of the multilayer reflective film 21 (layer on the end of the opposite side from the layer contacting the mask blank substrate 10) that is parallel to the contact surface between the mask blank substrate 10 and the multilayer reflective film 21.

In addition, from the viewpoint of enhancing the reflectance properties of the multilayer reflective film with respect to EUV light, the surface roughness of the film surface of the multilayer reflective film 21 at a spatial frequency of 10 $\mu m^{-1}$ to 100 $\mu m^{-1}$ is preferably less than 0.13 nm in terms of the root mean square roughness (Rms).

The following provides an explanation of power spectral density (PSD) and Rms, which are parameters that indicate the surface morphology of the film surface of the multilayer reflective film 21 in the substrate with a multilayer reflective film 20 of the present invention.

<Power Spectral Density>

Surface irregularities in the film surface of the multilayer reflective film 21 obtained by measuring the film surface with, for example, an atomic force microscope can be represented as the amplitude intensity at a prescribed spatial frequency by Fourier transform. This consists of representing measurement data of the surface irregularities (namely, the fine morphology of the film surface of the multilayer reflective film 21) as the sum of waves of prescribed spatial frequencies, or in other words, dividing the surface morphology of the multilayer reflective film 21 into waves of prescribed spatial frequencies.

This type of power spectral analysis makes it possible to quantify the fine surface morphology of the multilayer reflective film 21. If $Z(x,y)$ is taken to be height data (numerical value) at a specific x,y coordinate in the surface morphology, then the Fourier transform thereof is given by the following Equation (2).

[Equation 1]

$$F(u, v) = \frac{1}{N_x N_y} \sum_{u=0}^{N_x-1} \sum_{v=0}^{N_y-1} Z(x, y) \exp\left[-i2\pi\left(\frac{ux}{N_x} + \frac{vy}{N_y}\right)\right] \quad (2)$$

Here, Nx and Ny are the number of data sets in the x direction and y direction. u=0, 1, 2, ... Nx−1 and v=0, 1, 2, ... Ny−1, then the spatial frequency f is given by the following Equation (3):

[Equation 2]

$$f = \left\{\left[\frac{u}{(N_x - 1)d_x}\right]^2 + \left[\frac{v}{(N_y - 1)d_y}\right]^2\right\}^{1/2} \quad (3)$$

(wherein, $d_x$ represents minimum resolution in the x direction, and $d_y$ represents minimum resolution in the y direction).

The power spectral density PSD is given by the following Equation (4).

[Equation 3]

$$P(u,v)=|F(u,v)|^2 \quad (4)$$

This power spectral analysis is superior in that it enables changes in the surface morphology of the multilayer reflective film 21 to be perceived not only as a simple change in height, but also as a change at that spatial frequency, and is a technique used to analyze the effects of microreactions at the atomic level on the surface of the multilayer reflective film.

In order to achieve the aforementioned object, the substrate with a multilayer reflective film 20 of the present invention is such that the PSD at a spatial frequency region of 1 $\mu m^{-1}$ to 10 $\mu m^{-1}$, obtained by measuring a 1 $\mu m \times 1$ $\mu m$ region of the film surface of the multilayer reflective film 21 with an atomic force microscope, is not more than 20 $nm^4$, and the PSD at a spatial frequency of 10 $\mu m^{-1}$ to 100 $\mu m^{-1}$ is not more than 10 $nm^4$ and preferably not more than 8 $nm^4$. In the case of observing a region of a spatial frequency of 1 $\mu m^{-1}$ to 100 $\mu m^{-1}$, observation of a 1 $\mu m \times 1$ $\mu m$ region with an atomic force microscope yields highly reliable data.

In the present specification, the aforementioned 1 $\mu m \times 1$ $\mu m$ region is a region centering on the film surface of the multilayer reflective film 21. For example, if the film surface of the multilayer reflective film 21 of the substrate with a multilayer reflective film 20 has a rectangular shape, the center is located at the intersection of diagonal lines of the rectangle. Namely, the intersection and the center of the region coincide (and the definition of the center of the region is the same as that of the center of the film surface). This applies similarly to a mask blank substrate, protective film and absorber film described later.

Since a highly sensitive defect inspection apparatus that uses light having an inspection light source wavelength of 266 nm, 193 nm or 13.5 nm is susceptible to erroneously detecting roughness in the aforementioned spatial frequency region of 1 µm$^{-1}$ to 10 µm$^{-1}$ and/or spatial frequency region of 10 µm$^{-1}$ to 100 µm$^{-1}$ as a pseudo defect, by suppressing roughness in these regions (PSD that is amplitude intensity) to not exceed a fixed value, the number of detected defects, including pseudo defects, can be suppressed while being able to reliably detect critical errors that must not be failed to be detected as a result thereof.

By setting power spectral density in a specific spatial frequency region of the film surface of the multilayer reflective film 21 of the substrate with a multilayer reflective film 20 to be within a specific range as described above, the number of defects, including pseudo defects, detected in a defect inspection by, for example, the MAGICS 7360 Mask Substrate/Blank Defect Inspection Apparatus for EUV exposure manufactured by Lasertec Corp., the Teron 600 Series of Reticle, Optical Mask, Blank, UV Mask/Blank Defect Inspection Apparatuses manufactured by KLA-Tencor Corp., or the Actinic Defect Inspection Apparatus using light of the same wavelength as the exposure light wavelength (EUV light), can be greatly suppressed. As a result, critical defects can be made to be more conspicuous, and in the case a critical defect has been detected, various measures can be taken such as removing the critical defect or designing a mask so that an absorber pattern 27 is positioned over the critical defect in a reflective mask 40 described later.

Furthermore, the aforementioned inspection light source wavelength is not limited to 266 nm, 193 nm and 13.5 nm. Wavelengths of 532 nm, 488 nm, 364 nm and 257 nm may also be used as inspection light source wavelengths.

(Ion Beam Sputtering)

In the present invention, the aforementioned multilayer reflective film 21 is formed by a specific ion beam sputtering in order to achieve the aforementioned PSD in the spatial frequency region. For example, in the case the multilayer reflective film 21 is a Mo/Si periodic multilayer film as previously described, an Si film having a thickness of about several nm is first deposited on the mask blank substrate 10 using an Si target by ion beam sputtering followed by depositing a Mo film having a thickness of about several nm using a Mo target, and then laminating these films for 40 to 60 cycles, with the above depositions constituting a single cycle, to form the multilayer reflective film 21.

Conventionally, from the viewpoints of smoothness and surface uniformity of the multilayer reflective film to be formed, a high refractive index layer and a low refractive index layer were deposited by allowing sputtered particles to arrive at a large angle relative to the normal of the main surface of the mask blank substrate 10 (line perpendicular to the main surface), or in other words, at an angle that is diagonal or nearly parallel to the main surface of the substrate 10.

In this type of method, it was not possible to achieve a level of smoothness to a degree that allows suppression of the number of defects, including pseudo defects, detected in the multilayer reflective film formed in a defect inspection using a highly sensitive defect inspection apparatus as previously described.

As a result of adopting a different approach from the common general technical knowledge based on the smoothness and surface uniformity of a multilayer reflective film as described above and conducting experiments using various incident angles to the normal of the main surface of the mask blank substrate 10, the inventors of the present invention have found that by making sputtered particles of a high refractive index material and a low refractive index material enter at a small angle relative to the normal, such as an angle of 0 degree to 30 degrees and preferably 0 degree to 20 degrees, a specific PSD in the aforementioned specific spatial frequency region can be achieved, and as a result thereof, the aforementioned number of detected defects, including pseudo defects, can be suppressed and critical defects can correspondingly be made to be more conspicuous.

In addition, when the film surface of the multilayer reflective film 21 is inspected for defects using the Actinic defect inspection apparatus having an inspection light source wavelength of 13.5 nm, there is a fixed background level (BGL), and if this is more than a certain threshold value, portions that are actually free of defects end up being detected as pseudo defects. This BGL can be lowered if ion beam sputtering is carried out at the aforementioned incident angle. This is also thought to contribute to the suppression of detection of pseudo defects in the substrate with a multilayer reflective film 20 manufactured according to the method of the present invention.

<Surface Roughness (Rms) at Spatial Frequency of 10 µm$^{-1}$ to 100 µm$^{-1}$>

In order to maintain reflectance of the multilayer reflective film 21 with respect to EUV light at a high level as previously described and suppress the number of detected defects, including pseudo defects, the surface roughness (Rms) in the multilayer reflective film 21 at a spatial frequency of 10 µm$^{-1}$ to 100 µm$^{-1}$ is less than 0.13 nm and preferably less than 0.12 nm. Here, Rms (root mean square) is a parameter defined by Equation (1) in [Equation 4] to be described later, and is the surface roughness (Rms) determined by extracting the roughness component at a spatial frequency of 10 µm$^{-1}$ to 100 µm$^{-1}$ with DI Dimension 3100 Atomic Force Microscope (Veeco Instruments Inc.).

<Protective Film>

A protective film 22 (see FIG. 3) can also be formed on the multilayer reflective film 21 formed in the manner described above in order to protect the multilayer reflective film 21 from dry etching and wet cleaning in a process of manufacturing a reflective mask for EUV lithography. In this manner, a form having the multilayer reflective film 21 and the protective film 22 on the mask blank substrate 10 can also be used as a substrate with a multilayer reflective film in the present invention.

In addition, although examples of materials that can be used for the aforementioned protective film 22 include materials such as Ru, Ru—(Nb,Zr,Y,B,Ti,La,Mo), Si—(Ru, Rh,Cr,B), Si, Zr, Nb, La and B, among these, the application of a material comprising ruthenium (Ru) results in more favorable reflectance properties of the multilayer reflective film. Specifically, the material is preferably Ru, Ru—(Nb, Zr,Y,B,Ti,La,Mo). This type of protective film is particularly effective in the case of using a Ta-based material for the absorber film described later and patterning the absorber film by dry etching with a Cl-based gas.

In addition, in the aforementioned substrate with a multilayer reflective film 20, the film surface of the protective film 22 is such that power spectral density at a spatial frequency of 1 µm$^{-1}$ to 10 µm$^{-1}$, obtained by measuring a 1 µm×1 µm region with an atomic force microscope, is preferably not more than 20 nm$^4$, and power spectral density at a spatial frequency of 10 μm$^{-1}$ to 100 μm$^{-1}$ is preferably not more than 10 nm$^4$.

As a result of employing such a configuration, in the case of carrying out a defect inspection on the substrate with a multilayer reflective film 20 with a highly sensitive defect inspection apparatus that uses the previously exemplified UV laser having an inspection light source wavelength of 266 nm, ArF excimer laser having an inspection light source wavelength of 193 nm or EUV light having an inspection light source wavelength of 13.5 nm, the number of detected defects, including pseudo defects, can be greatly suppressed.

In addition, the surface of the protective film 22 refers to a surface of the protective film 22 on the opposite side from the surface contacting the multilayer reflective film 21 that is parallel to the main surface of the mask blank substrate 10.

Furthermore, from the viewpoint of enhancing reflectance properties of the multilayer reflective film 21 with respect to EUV light, the surface roughness of the film surface of the protective film 22 at a spatial frequency of 10 μm$^{-1}$ to 100 μm$^{-1}$ is preferably less than 0.13 nm in terms of root mean square roughness (Rms).

After depositing the multilayer reflective film 21, the protective film 22 can be subsequently formed by carrying out ion beam sputtering, DC sputtering or RF sputtering so that the protective film 22 is deposited at diagonal angle relative to the normal of the main surface of the mask blank substrate 10.

Furthermore, in the substrate with a multilayer reflective film 20, a back side electrically conductive film 23 (see FIG. 3) can also be formed on the side of the mask blank substrate 10 on the opposite side from side contacting the multilayer reflective film 21 for the purpose of serving as an electrostatic chuck. Such form having the multilayer reflective film 21 and the protective film 22 on the side of which a transfer pattern is formed, and having a back side electrically conductive film 23 on the side opposite from the side contacting the multilayer reflective film 21, is also included in the substrate with a multilayer reflective film in the present invention. In addition, the electrical property (sheet resistance) required for the back side electrically conductive film 23 is normally not more than 100Ω/□. The method used to form the back side electrically conductive film 23 is known, and the film can be formed, for example, using a metal or alloy target of Cr, Ta and the like by ion beam sputtering, DC sputtering or RF sputtering.

Furthermore, although the back side electrically conductive film 23 was explained in the aforementioned explanation as being formed on the back side opposite from the aforementioned main surface after having deposited the multilayer reflective film 21 and the protective film 22 on the main surface of the mask blank substrate 10 on the side of which a transfer pattern is formed, the present invention is not limited thereto. The substrate with a multilayer reflective film 20 may also be manufactured by forming the back side electrically conductive film 23 on the main surface opposite from the main surface of the mask blank substrate 10 on the side of which a transfer pattern is formed, followed by depositing the multilayer reflective film 21 and then the protective film 22 on the main surface on the side of which the transfer pattern is formed.

In addition, the substrate with a multilayer reflective film 20 of the present embodiment may also have a base layer formed between the mask blank substrate 10 and the multilayer reflective film 21. The base layer can be formed for the purpose of improving smoothness of the main surface of the substrate 10, for the purpose of reducing defects, for the purpose of the effect of enhancing reflectance of the multilayer reflective film 21, and for the purpose of compensating for stress in the multilayer reflective film 21.

<Mask Blank Substrate>

Next, an explanation is provided of the mask blank substrate 10 that constitutes the substrate with a multilayer reflective film 20 of the present embodiment as previously explained.

Figure 2:
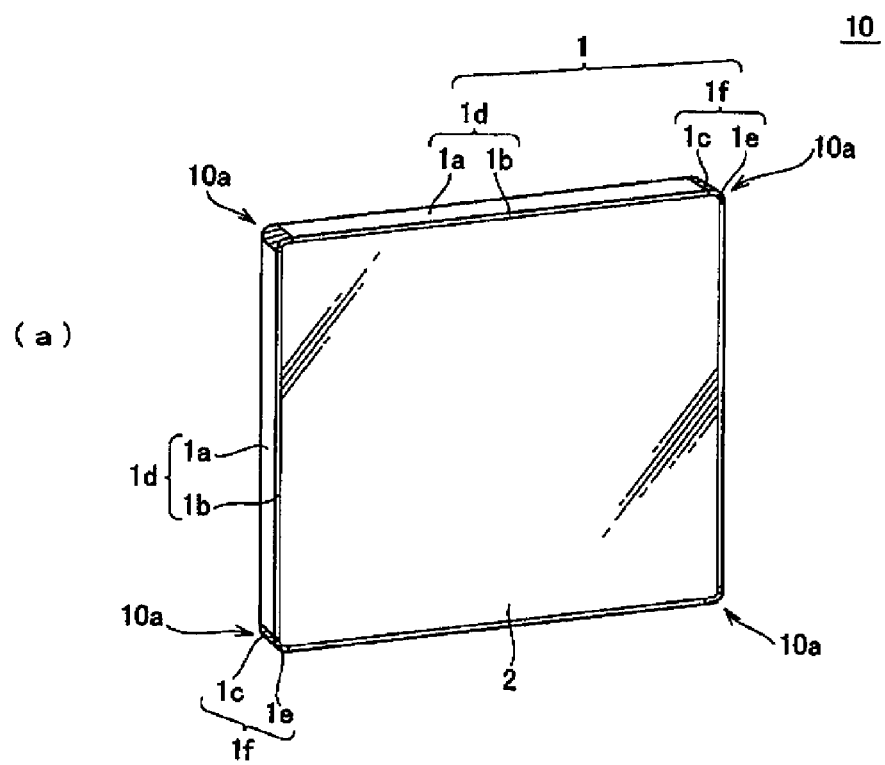
FIG. 2(a) is a perspective view showing a mask blank substrate 10 used in a substrate with a multilayer reflective film according to one embodiment of the present invention.
FIG. 2(b) is a cross-sectional schematic diagram showing the mask blank substrate 10 in the present embodiment.
Figure 2:
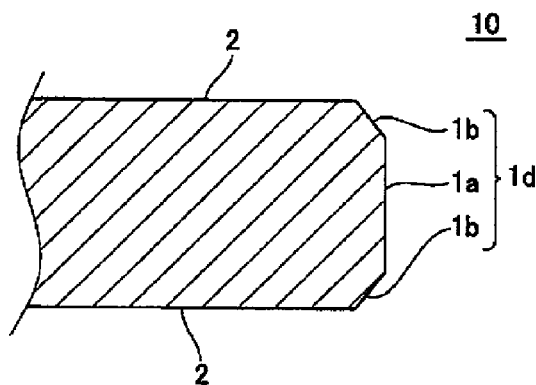

FIG. 2(a) is a perspective view showing the mask blank substrate 10 of the present embodiment. FIG. 2(b) is a cross-sectional schematic diagram showing the mask blank substrate 10 of the present embodiment.

The mask blank substrate 10 (or simply, substrate 10) is a rectangular plate-like body that has two opposing main surfaces 2 and edge faces 1. The two opposing main surfaces 2 constitute the upper surface and lower surface of the plate-like body and are formed so as to be mutually opposed. In addition, at least one of the two opposing main surfaces 2 is the main surface where a transfer pattern is formed.

The edge faces 1 constitute the lateral surfaces of this plate-like body and are adjacent to the outer edges of the opposing main surfaces 2. The edge faces 1 have a flat edge face portion 1d and curved edge face portions 1f. The flat edge face portion 1d is a surface that connects a side of one of the opposing main surfaces 2 and a side of the other opposing main surface 2, and comprises a lateral surface portion 1a and chamfered inclined surface portions 1b. The lateral surface portion 1a is a portion that is nearly perpendicular to the opposing main surfaces 2 in the flat edge face portion 1d (T surface). The chamfered inclined surface portions 1b are portions that are chamfered between the lateral surface portion 1a and the opposing main surfaces 2 (C surface), and are formed between the lateral surface portion 1a and the opposing main surfaces 2.

The curved edge face portions 1f are portions adjacent to the vicinity of the corner portions 10a of the substrate 10 when the substrate 10 is viewed from overhead (R portions), and comprise a lateral surface portion 1c and chamfered inclined surface portions 1e. Here "the substrate 10 is viewed from overhead" means that the substrate 10 is seen from a direction perpendicular to the opposing main surfaces 2. In addition, the corner portions 10a of the substrate 10 refer to locations in the vicinity of the intersections of two sides along the outer edges of the opposing main surfaces 2. The intersections of two sides may also be intersections of lines respectively extending from each of the two sides. In the present example, the curved edge face portions 1f are formed to have a curved shape by rounding the corner portions 10a of the substrate 10.

For example, in the mask blank substrate 10 having the configuration explained above, at least in the main surface on the side of which a transfer pattern is formed, namely in a reflective mask blank 30, described below, the main surface on the side of which the multilayer reflective film 21, the protective film 22 and the absorber film 24 are formed preferably has the power spectral density, surface roughness (Rmax, Rms) and flatness indicated below.

(Power Spectral Density)

In the mask blank substrate 10 in the present embodiment, PSD at a spatial frequency region of 1 μm$^{-1}$ to 10 μm$^{-1}$, obtained by measuring a 1 μm×1 μm region on the main surface thereof on the side of which a transfer pattern is formed with an atomic force microscope, is preferably not more than 10 nm$^4$. If the mask blank substrate 10 satisfies this PSD range, it becomes easy to form the multilayer reflective film 21 that satisfies the previously explained PSD, and in the substrate with a multilayer reflective film 21 of the present embodiment, the number of defects, including pseudo defects, detected is effectively suppressed even when an inspection is carried out with a highly sensitive defect inspection apparatus that uses light having a wavelength of 266 nm, 193 nm or 13.5 nm for the inspection light source wavelength, thereby making it possible to make critical defects more conspicuous. Moreover, pseudo defects are also difficult to be detected even in the case of carrying out an inspection on the mask blank substrate 10 per se.

As was previously described, by setting power spectral density in a specific spatial frequency region on the main surface of the mask blank substrate 10 at within a specific range, it becomes easy to greatly suppress the number of defects, including pseudo defects, detected in a defect inspection of the multilayer reflective film 21 by, for example, the MAGICS 7360 Mask Substrate/Blank Defect Inspection Apparatus for EUV exposure manufactured by Lasertec Corp., the Teron 600 Series of Reticle, Optical Mask/Blank, UV Mask/Blank Defect Inspection Apparatuses manufactured by KLA-Tencor Corp., or the Actinic Defect Inspection Apparatus using EUV light, and the number of detected defects, including pseudo defects, can be suppressed in a defect inspection of the mask blank substrate 10 per se as well.

(Surface Roughness (Rmax,Rms))

Root mean square (Rms), which is a typical indicator of surface roughness of the mask blank substrate 10, is the root mean square roughness, and is the square root of a value obtained by averaging the squares of the deviation from an average line to a measurement curve. Namely, Rms is represented by the following Equation (1):

[Equation 4]

$$\text{Rms} = \sqrt{\frac{1}{l}\int_0^l Z^2(x)\,dx} \quad (1)$$

(wherein, l represents a reference length and Z represents the height from the reference line).

Rmax, which is also a typical indicator of surface roughness, refers to the maximum height of surface roughness, and is the sum of the absolute values of the maximum value of the height of the peak and the maximum value of the depth of the trough of a roughness curve. In addition, Rms can be obtained by measuring a 1 μm×1 μm region on the main surface of the mask blank substrate 10 with an atomic force microscope. Further, Rmax and Rms are defined in Japanese Industrial Standard JIS B0601 (2001).

In addition, the aforementioned root mean square roughness (Rms) is preferably not more than 0.12 nm and more preferably not more than 0.10 nm.

Furthermore, the maximum height (Rmax) is preferably not more than 1.2 nm and more preferably not more than 1.0 nm.

From the viewpoint of improving optical properties such as reflectance of the multilayer reflective film 21, the protective film 22 and the absorber film 24 formed on the mask blank substrate 10, it is preferable to control both the parameters of root mean square roughness (Rms) and maximum height (Rmax). The preferable surface roughness of the surface of the mask blank substrate 10 is such that the root mean square roughness (Rms) is not more than 0.12 nm and the maximum height (Rmax) is not more than 1.2 nm, and more preferably such that the root mean square roughness (Rms) is not more than 0.10 nm and the maximum height (Rmax) is not more than 1.0 nm.

In addition, the main surface of the mask blank substrate 10 on the side of which a transfer pattern is formed is preferably subjected to surface processing so as to have high flatness from the viewpoint of at least obtaining pattern transfer accuracy and positional accuracy. In the case of an EUV reflective mask blank substrate, flatness in a 142 mm×142 mm region on the main surface of the substrate 10 on the side of which a transfer pattern is formed is preferably not more than 0.1 and particularly preferably is not more than 0.05 μm. Furthermore, the main surface on the opposite side from the side of which a transfer pattern is formed is a surface on which an electrostatic chuck is conducted when placing in an exposure apparatus, and the flatness thereof in a 142 mm×142 mm region is preferably not more than 1 μm and particularly preferably not more than 0.5 μm.

(Method of Manufacturing Mask Blank Substrate)

A preferable mask blank substrate in the present invention as previously explained can be manufactured by surface processing the main surface thereof on the side of which a transfer pattern is formed so as to have a prescribed surface morphology, or in other words, so that the power spectral density at a spatial frequency of 1 μm$^{-1}$ to 10 μm$^{-1}$, obtained by measuring a 1 μm×1 μm region on the main surface with an atomic force microscope, is not more than 10 nm$^4$. In addition, surface processing for achieving the aforementioned surface roughness (such as Rmax or Rms) and flatness is also preferably carried out in combination therewith. The methods used for that surface processing are known, and can be employed in the present invention without any particular limitations thereon.

Examples of known surface processing methods include magneto rheological finishing (MRF), chemical mechanical polishing (CMP), gas cluster ion beam etching (GCIB) and dry chemical planarization (DCP) using topical plasma etching. MRF is a topical processing method in which polishing is carried out topically by allowing polishing abrasive particles contained in a magnetic fluid to contact a processing target (mask blank substrate) at a high speed together with controlling the residence time of the abrasive particles at the contact portion. CMP is a topical processing method in which primarily convex portions on the surface of a processing target are polished by using a small diameter polishing pad and abrasive (containing polishing abrasive particles such as colloidal silica) and controlling the residence time of the abrasive at the contact portion between the small diameter polishing pad and the processing target (mask blank substrate). GCIB is a topical processing method that comprises generating gas cluster ions by letting a reactive substance that is gas at normal temperature and normal pressure (source gas) spout into a vacuum apparatus while allowing to expand adiabatically, and accelerating the gas cluster ions formed by ionizing by electron irradiation in a high electric field to form a gas cluster ion beam followed by irradiating the processing target therewith. DCP is a topical processing method in which dry etching is carried out topically by carrying out plasma etching topically and controlling the amount of plasma etching corresponding to the degree of convex surface.

Any material may be used for the material of the mask blank substrate provided it has low thermal expansion properties. For example, an $SiO_2$—$TiO_2$-based glass having low thermal expansion properties (such as a two-element system ($SiO_2$—$TiO_2$) or three-element system (such as $SiO_2$—$TiO_2$—$SnO_2$)), or so-called multicomponent glasses such as $SiO_2$—$Al_2O_3$—$Li_2O$-based crystallized glass, can be used. In addition, a substrate other than glass made of silicon or metal and the like can also be used. An example of the metal substrate is an invar alloy (Fe—Ni-based alloy).

As was previously described, in the case of a mask blank substrate, although a multicomponent glass material is used since the substrate is required to have low thermal expansion properties, there is a problem of it being difficult to obtain high smoothness in comparison with synthetic quartz glass used in transparent mask blank substrates. In order to solve this problem, a thin film composed of a metal, an alloy, or a material containing at least one of oxygen, nitrogen and carbon in either thereof, is formed on a substrate composed of the multicomponent glass material. A surface having surface roughness within the aforementioned range can then be formed comparatively easily by mirror polishing and treating the surface of the thin film.

Preferable examples of the material of the aforementioned thin film include Ta (tantalum), alloys containing Ta and Ta compounds containing at least one of oxygen, nitrogen and carbon in either thereof. Examples of Ta compounds that can be used include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON. Among these Ta compounds, TaN, TaON, TaCON, TaBN, TaBON, TaBCON, TaHfN, TaHfON, TaHfCON, TaSiN, TaSiON and TaSiCON that contain nitrogen (N) are more preferable. Furthermore, from the viewpoint of high smoothness of the thin film surface, the aforementioned thin film preferably has an amorphous structure. The crystal structure of the thin film can be measured with an X-ray diffraction analyzer (XRD).

In addition, a preferable method of manufacturing the mask blank substrate in the present invention as previously described has a surface processing step of processing the surface so as to obtain surface morphology that has a prescribed PSD in the aforementioned prescribed spatial frequency region.

There are no particular limitations on the method used to carry out the surface processing step provided a prescribed PSD can be achieved in the aforementioned spatial frequency region. In order to suppress decreases in pattern contrast caused by stray light referred to as flare, PSD is preferably reduced in an intermediate spatial frequency region ($1 \times 10^{-2}$ μm$^{-1}$ to 1 μm$^{-1}$) longer than a high spatial frequency region that is the aforementioned spatial frequency region (not more than 1 μm$^{-1}$). In this case, this is preferably carried out by carrying out an intermediate spatial frequency region roughness reducing step and a high spatial frequency region roughness reducing step for setting PSD in a high spatial frequency region at within the aforementioned range.

In addition, in the case of observing a region of a spatial frequency of $1 \times 10^{-2}$ μm$^{-1}$ to 1 μm$^{-1}$, observation of a 0.14 mm×0.105 mm region with a non-contact surface morphology analyzer (such as the NewView 6300 manufactured by Zygo Corp.) yields highly reliable data. This region is centered on the main surface of the mask blank substrate in the same manner as the case of measuring a 1 μm×1 μm region with an atomic force microscope.

Among the aforementioned two steps, since the high spatial frequency region roughness reducing step typically requires a finer adjustment of roughness, and roughness of the high spatial frequency region may be affected by work in the intermediate spatial frequency region roughness reducing step while the opposite is hardly ever applicable, in the present invention, the high spatial frequency region roughness reducing step is preferably carried out after the intermediate spatial frequency region roughness reducing step.

These steps are preferably carried out by elastic emission machining (EEM) and/or catalyst-referred etching (CARE).

In particular, EEM is useful in the intermediate spatial frequency region roughness reducing step, while CARE is useful in the high spatial frequency region roughness reducing step.

{EEM}

EEM is a non-contact polishing method in which atoms on the surface of a processing target are removed in atomic units by allowing fine powder particles of not more than 0.1 μm to contact the processing target (mask blank substrate) in a nearly no-load state and utilizing the interaction (a type of chemical bonding) that occurs at the interface between the fine powder particles and processing target at that time.

In order to allow the fine powder particles to make contact in the no-load state, the processing target is, for example, placed in water, the fine powder particles are allowed to disperse in the water, and a rotating body such as a wheel is placed in the vicinity of the processed surface of the processing target and rotated. As a result of this rotary motion, flow referred to as high-speed shear flow is generated between the processed surface and rotating body that enables the fine powder particles to act on the processed surface.

The size of the rotating body is suitably selected corresponding to the size of the processing target. The shape of the rotating body is suitably selected corresponding to the region desired to be preferentially contacted (reacted) with machining fluid on the surface of the processing target. In the case of desiring to preferentially have the machining fluid make contact topically, a spherical shape or linear shape is used, while in the case of desiring to preferentially have the machining fluid make contact over a comparatively wide area, a cylindrical shape is used.

The material of the rotating body is preferably resistant to machining fluid and has as low elasticity as possible. Highly elastic (comparatively soft) material is undesirable because the shape of the rotating body undergoes deformation during rotation causing the shape to become unstable and resulting in the possibility of worsening processing accuracy. Examples of the material of the rotating body include polyurethane, glass and ceramics.

Although the rotating speed of the rotating body is suitably selected according to the PSD desired to be achieved, it is normally 50 rpm to 1000 rpm, and the duration of polishing when using a rotating body is normally 60 minutes to 300 minutes.

In general, during EEM processing, the gap between the processing target and the rotating body can be adjusted by arranging the processing target perpendicular to the rotating body and applying a prescribed load to the rotated rotating body. The rotating body is scanned in parallel to the axis of rotation while applying a prescribed load to the rotated rotating body. Once the edge of the processing area has been reached, the rotating body is then moved in parallel to the rotating body by a prescribed distance followed by scanning in the opposite direction. The entire area can be processed by repeating this procedure. Although the range of the load is suitably selected according to the PSD desired to be achieved in the same manner as previously described, it is normally set at within the range of 0.5 kg to 5 kg.

Although examples of the aforementioned fine powder particles used in EEM include cerium oxide, silica ($SiO_2$), colloidal silica, zirconium oxide, manganese dioxide and aluminum oxide, in the case the processing target is a glass substrate, zirconium oxide, aluminum oxide, colloidal silica and the like are preferably used for the fine powder particles. In addition, the average particle diameter of the fine powder particles is preferably not more than 100 nm (and average particle diameter is obtained by measuring an image at a magnification factor of 15 to $105 \times 10^3 \times$ using a scanning electron microscope (SEM)). Furthermore, in order to improve processing speed, the fine powder particles may be suspended in a solvent in which the processing target is placed to obtain a machining fluid followed by contacting this with the processing target.

In EEM, water in which the fine powder particles have been dispersed as previously described and an aqueous solution in the form of an acidic aqueous solution or alkaline aqueous solution may be used for the machining fluid, or either of the aforementioned aqueous solutions may be used for the machining fluid. Pure water or ultrapure water is preferable in the case of using water.

Examples of the acidic aqueous solution include aqueous solutions of sulfuric acid, hydrochloric acid, hydrofluoric acid and hydrofluorosilicic acid. Polishing speed is improved by containing an acidic aqueous solution in the machining fluid during non-contact polishing. However, since the glass substrate ends up being damaged depending on acid type or in the case the concentration of the acid is high, an acid and concentration thereof are suitably selected that do not damage the glass substrate.

Examples of the alkaline aqueous solution include aqueous solutions of potassium hydroxide and sodium hydroxide. Polishing speed is improved by containing an alkaline aqueous solution in the machining fluid during non-contact polishing. In addition, in the case ultrafine latent defects (such as cracks or scratches) are present on the surface of the glass substrate, since these can be made to be more conspicuous, fine defects can be more reliably detected in subsequent inspection steps. The alkaline aqueous solution is adjusted within a range that does not dissolve the polishing abrasive particles contained in the machining fluid, and is preferably adjusted so that the pH of the machining fluid is 9 to 12.

{Catalyst-Referred Etching (CARE)}

Next, the principle of CARE processing involves arranging a processing target (mask blank substrate) and catalyst in a treatment liquid or supplying a treatment liquid between the processing target and the catalyst, allowing the processing target and catalyst to make contact, and processing the processing target with the active species generated from molecules in the treatment liquid that have been adsorbed on the catalyst at that time. Furthermore, in the case the processing target is composed of a solid oxide such as glass, the processing principle involves using water for the treatment liquid, contacting the processing target and catalyst in the presence of water, and allowing the catalyst and surface of the processing target to undergo relative motion to enable decomposition products of hydrolysis to be removed from the surface of the processing target.

Specifically, the CARE processing method comprises processing a processing target by placing the processing target in a treatment liquid that does not dissolve the processing target in the normal state, arranging a processing reference surface of a surface plate having the reference surface, which surface is composed of a metal such as platinum, gold, iron or molybdenum, an alloy such as SUS or a ceramic solid catalyst, in contact with or in extremely close proximity to the processed surface of the processing target (or supplying a treatment liquid between the processing target and the catalyst), and allowing the processing target and the processing reference surface to undergo relative motion in the treatment liquid so that the processing target reacts with active species formed on the surface of the processing reference surface. Furthermore, in the case the material of the processing target is not dissolved in the normal state by a treatment liquid in which halogen-containing molecules are dissolved therein, a treatment liquid in which halogen-containing molecules are dissolved therein can also be used. Here, although hydrogen halides are preferable for the halogen-containing molecules, molecules containing a C—F, S—F, N—F, C—Cl, S—Cl or N—Cl bond can also be used.

Here, an aqueous solution in which hydrogen halide molecules are dissolved is referred to as a hydrohalogenic acid. Although examples of halogens include fluorine (F), chlorine (Cl), bromine (Br) and iodine (I), since chemical reactivity decreases as atomic number becomes higher, considering actual processing rate when used as a treatment liquid, hydrofluoric acid (HF aqueous solution) can be used preferably. However, an HF aqueous solution ends up dissolving glass ($SiO_2$), while an HCl aqueous solution selectively elutes Ti contained in low thermal expansion glass. A hydrohalogenic acid is preferably used after adjusting to a suitable concentration in consideration of these factors and processing time.

A metal such as platinum, gold, iron or molybdenum, an alloy such as SUS, or a ceramic solid catalyst, which promotes a reaction that extracts hydrogen ions and atoms by oxidizing hydrogen, is used for the catalyst. Since active species are generated only on the processing reference surface, these active species immediately lose activity after leaving the processing reference surface of the surface plate, side reaction rarely occurs and the principle of the surface processing is not a mechanical polishing but a chemical reaction, damage to the processing target is extremely low, superior smoothness can be achieved, and roughness in a high spatial frequency region can be effectively reduced.

Moreover, in the case the mask blank substrate is a glass substrate and a transition metal such as platinum, gold, silver, copper, molybdenum, nickel or chromium is used as a solid catalyst, the surface of the substrate can be processed by allowing a hydrolysis reaction to proceed and carrying out CARE in water. CARE is preferably carried out from the viewpoints of cost and processing properties.

The processing reference surface composed of a solid catalyst on a surface plate as previously explained is normally formed by depositing a solid catalyst on a prescribed pad. There are no particular limitations on the pad, and those made of rubber, transparent resin, foamable resin or non-woven fabric can be used.

As has been previously described, CARE comprises carrying out surface processing by allowing a processing target and the processing reference surface to undergo relative motion in a treatment liquid, and removing the surface of the processing target by reacting the processing target with an active species generated on the surface of the processing reference surface.

In addition, CARE processing conditions can be set to, for example, a range of 5 rpm to 200 rpm for the rotating speed of the surface plate, 5 rpm to 200 rpm for the rotating speed of the processing target, 10 hPa to 1000 hPa for the processing pressure, and 5 minutes to 120 minutes for the processing time.

A typical CARE processing apparatus for carrying out CARE in the manner explained above is shown in FIG. 9. This CARE processing apparatus 100 has a treatment tank 124, a catalyst surface plate 126 arranged to rotate freely in the treatment tank 124, and a substrate holder 130 that removably holds a processing target 128 (mask blank substrate) with the surface (processed surface) facing downward. The substrate holder 130 is coupled to the end of a vertically movable rotating shaft 132 provided at a location parallel and eccentric to the center of the axis of rotation of the catalyst surface plate 126. The catalyst surface plate 126 has, for example, a platinum solid catalyst 142 of a prescribed thickness formed on the surface of base 140 made of a rigid material composed of, for example, stainless steel. In addition, although the solid catalyst may be used in bulk, it may also employ a configuration where the platinum 142 is formed on an elastic base material such as fluorine rubber which is inexpensive and has good shape stability.

In addition, a temperature control mechanism in the form of a heater 170 for controlling the temperature of the processing target 128 held in the holder 130 is embedded within the substrate holder 130, extending into the rotating shaft 132. A treatment liquid supply nozzle 174, which supplies the inside of the treatment tank 124 with treatment liquid (such as pure water) controlled to have a prescribed temperature by a temperature control mechanism in the form of a heat exchanger 172, is arranged above the treatment tank 124. Moreover, a temperature control mechanism in the form of a liquid flow path 176 that controls the temperature of the catalyst surface plate 126 is provided within the catalyst surface plate 126.

An example of a method by which CARE is carried out by this CARE processing apparatus 100 is as follows. Treatment liquid is supplied to the catalyst surface plate 126 from the treatment liquid supply nozzle 174. The processing target 128 held in the substrate holder 130 is pressed against the surface of the platinum (catalyst) 142 of the catalyst surface plate 126 at a prescribed pressure, the catalyst surface plate 126 and the processing target 128 are rotated while causing treatment liquid to be interposed in the contact area (processing area) between the processing target 128 and the platinum (catalyst) 142 of the catalyst surface plate 126, and the surface (lower surface) of the processing target 128 is subjected to removal processing (etching) to form a flat surface. Furthermore, the processing target 128 may also be brought into extremely close proximity to the platinum (catalyst) 142 followed by removal processing (etching) of the surface of the processing target 128 to a flat surface without pressing the processing target 128 held in the substrate holder 130 against the platinum (catalyst) 142 of the catalyst surface plate 126 at a prescribed pressure.

As a result of carrying out each of the steps explained above, PSD values in an intermediate spatial frequency region and high spatial frequency region are adjusted to be equal to or less than prescribed values, and a mask blank substrate is manufactured that is provided with the preferable power spectral density and surface roughness in the present invention. In the present invention, other steps carried out in the manufacturing process of mask blank substrates may also be carried out.

[Method of Manufacturing Reflective Mask Blank]

Figure 3:
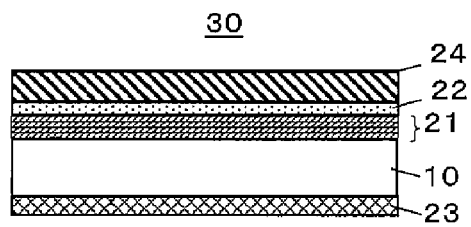
FIG. 3 is a cross-sectional schematic diagram showing one example of the configuration of a reflective mask blank according to one embodiment of the present invention.

Next, an explanation is provided of a method of manufacturing the reflective mask blank 30 according to one embodiment of the present invention below. FIG. 3 is a schematic diagram showing the reflective mask blank 30 of the present embodiment.

The reflective mask blank 30 of the present embodiment is manufactured by forming an absorber film 24 to serve as a transfer pattern on the protective film 22 of the previously explained substrate with a multilayer reflective film 20 (or on the multilayer reflective film 21 in the case the protective film 22 is not present).

There are no particular limitations on the material of the aforementioned absorber film 24. For example, a material having the function of absorbing EUV light that is composed of Ta (tantalum) alone or having Ta as the main component thereof is used preferably. A material having Ta as the main component thereof is normally a Ta alloy. The crystalline state of this absorber film is such that it preferably has an amorphous or microcrystalline structure from the viewpoints of smoothness and flatness. Examples of materials that can be used for the material having Ta as the main component thereof include materials containing Ta and B, materials containing Ta and N, materials containing Ta and B and further containing at least O or N, materials containing Ta and Si, materials containing Ta, Si and N, materials containing Ta and Ge, and materials containing Ta, Ge and N. In addition, an amorphous structure is easily obtained by adding, for example, B, Si, Ge and the like to Ta, thereby making it possible to improve smoothness of the absorber film 24. Moreover, if N or O is added to Ta, resistance to oxidation improves, thereby making it possible to improve stability over time.

The surface of the absorber film 24 preferably has power spectral densities within the aforementioned ranges described regarding the multilayer reflective film 21 (namely, such that the PSD at a spatial frequency of 1 $\mu m^{-1}$ to 10 $\mu m^{-1}$ is not more than 20 $nm^4$ and the power spectral density at a spatial frequency of 10 $\mu m^{-1}$ to 100 $\mu m^{-1}$ is not more than 10 $nm^4$) from the viewpoint of suppressing the detection of pseudo defects. The absorber film 24 is preferably made to have an amorphous structure or microcrystalline structure in order to maintain the surface morphology of the substrate with a multilayer reflective film 20 and the mask blank substrate 10 having PSD within the aforementioned ranges, and enable the surface of the absorber film 24 to have power spectral densities within the aforementioned ranges. Crystal structure can be confirmed with an X-ray diffraction analyzer (XRD).

As a result of employing this configuration, in the case of detecting defects in the reflective mask blank 30 with a highly sensitive defect inspection apparatus that uses a UV laser having a wavelength of 266 nm, an ArF excimer laser having a wavelength of 193 nm or EUV light having a wavelength of 13.5 nm for the inspection light source wavelength as previously exemplified, the number of detected defects, including pseudo defects, can be greatly suppressed. In addition, the surface of the absorber film 24 refers to the surface of the absorber film 24 on the opposite side from the surface that contacts the protective film 22 or the multilayer reflective film 21 and that is parallel to the main surface of the mask blank substrate 10.

As was previously described, since roughness (PSD) in the aforementioned spatial frequency region of the film surface of the substrate with a multilayer reflective film 20 of the present invention (the multilayer reflective film 21 or the protective film 22) is adequately suppressed resulting in extremely superior flatness, PSD in the aforementioned spatial frequency region of the absorber film 24 formed thereon can be easily set within a range capable of significantly suppressing the number of detected defects, including pseudo defects.

Furthermore, the reflective mask blank of the present invention is not limited to the configuration shown in FIG. 3. For example, a resist film to serve as a mask for patterning the aforementioned absorber film 24 can also be formed on the absorber film 24, and this reflective mask blank with resist film is also a reflective mask blank of the present invention. In addition, the resist film formed on the absorber film 24 may be a positive resist or negative resist. In addition, the resist film may also be for electron beam drawing or laser drawing. Moreover, a so-called hard mask (etching mask) film can also be formed between the absorber film 24 and the resist film, and this embodiment is also a reflective mask blank of the present invention.

[Method of Manufacturing Reflective Mask]

Figure 4:
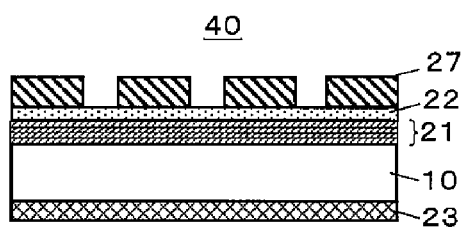
FIG. 4 is a cross-sectional schematic diagram showing one example of a reflective mask according to one embodiment of the present invention.

Next, the following provides an explanation of a method of manufacturing a reflective mask 40 according to one embodiment of the present invention. FIG. 4 is a schematic diagram showing the reflective mask 40 of the present embodiment.

The reflective mask 40 of the present embodiment is manufactured by patterning the absorber film 24 on the aforementioned reflective mask blank 30 and forming the absorber pattern 27 on the aforementioned protective film 22 or multilayer reflective film 21. The reflective mask 40 of the present embodiment can be used as a reflective mask 40 for lithography as a result of the portion where the absorber film 24 is present on the mask surface absorbing exposure light when exposed to exposure light such as EUV light, and other portions where the absorber film 24 has been removed reflecting exposure light at the exposed protective film 22 and multilayer reflective film 21.

[Method of Manufacturing Semiconductor Device]

A semiconductor device, having various wiring and other patterns formed on a semiconductor substrate, can be manufactured by transferring a transfer pattern, such as a circuit pattern based on the absorber pattern 27 of the reflective mask 40, to a resist film formed on a workpiece such as a semiconductor substrate via the use of the previously explained reflective mask 40 and a lithography process using an exposure apparatus, followed by going through various other steps.

Furthermore, fiducial marks can be formed on the previously described mask blank substrate 10, substrate with a multilayer reflective film 20 and reflective mask blank 30, and the coordinates of these fiducial marks and the locations of critical defects detected with a highly sensitive defect inspection apparatus as previously described can be controlled. When fabricating the reflective mask 40 based on the resulting critical defect location information (defect data), drawing data can be corrected and defects can be reduced so that the absorber pattern 27 is formed at those locations where critical defects are present based on the aforementioned defect data and transferred pattern (circuit pattern) data.

EXAMPLES

[Multilayer Reflective Film Deposition Conditions and BGL (Background Level)]

A multilayer reflective film was formed on a glass substrate under the various conditions indicated below and BGL was determined when carrying out defect inspections thereon using a highly sensitive defect inspection apparatus having an inspection light source wavelength of 13.5 nm. In addition, the glass substrate used underwent surface processing according to the processing method indicated in Example 1 described later, and the power spectral density of the surface of the glass substrate at a spatial frequency of 1 $\mu m^{-1}$ to 10 $\mu m^{-1}$, obtained by measuring a 1 $\mu m \times 1$ $\mu m$ region thereof with an atomic force microscope, was not more than 10 $nm^4$.

Example Sample 1: A multilayer reflective film was formed on the glass substrate by using an Mo target and an Si target and alternately laminating an Mo layer (low refractive index layer, thickness: 2.8 nm) and an Si layer (high refractive index layer, thickness: 4.2 nm) by ion beam sputtering (number of layers laminated: 40 pairs). The incident angles of the Mo and Si sputtered particles relative to the normal of the glass substrate during ion beam sputtering were 30 degrees, and the gas flow rate of the ion source was 8 sccm. Moreover, an Ru protective film (film thickness: 2.5 nm) was deposited on the multilayer reflective film by RF sputtering to obtain a substrate with a multilayer reflective film.

Comparative Example Sample 1: A multilayer reflective film was formed on the glass substrate by using an Mo target and an Si target and alternately laminating an Mo layer (thickness: 2.8 nm) and an Si layer (thickness: 4.2 nm) by ion beam sputtering (number of layers laminated: 40 pairs). The incident angles of the Mo and Si sputtered particles relative to the normal of the glass substrate during ion beam sputtering were 50 degrees for Mo and 40 degrees for Si, and the gas flow rate of the ion source was 8 sccm. Moreover, an Ru protective film (film thickness: 2.5 nm) was deposited on the multilayer reflective film to obtain a substrate with a multilayer reflective film.

Comparative Example Sample 2: A substrate with a multilayer reflective film was fabricated in the same manner as in Comparative Example Sample 1 with the exception of not forming the Ru protective film.

Comparative Example Sample 3: A substrate with a multilayer reflective film was fabricated in the same manner as in Comparative Example Sample 1 with the exception of changing the gas flow rate of the ion source to 16 sccm and not forming the Ru protective film.

Figure 5:
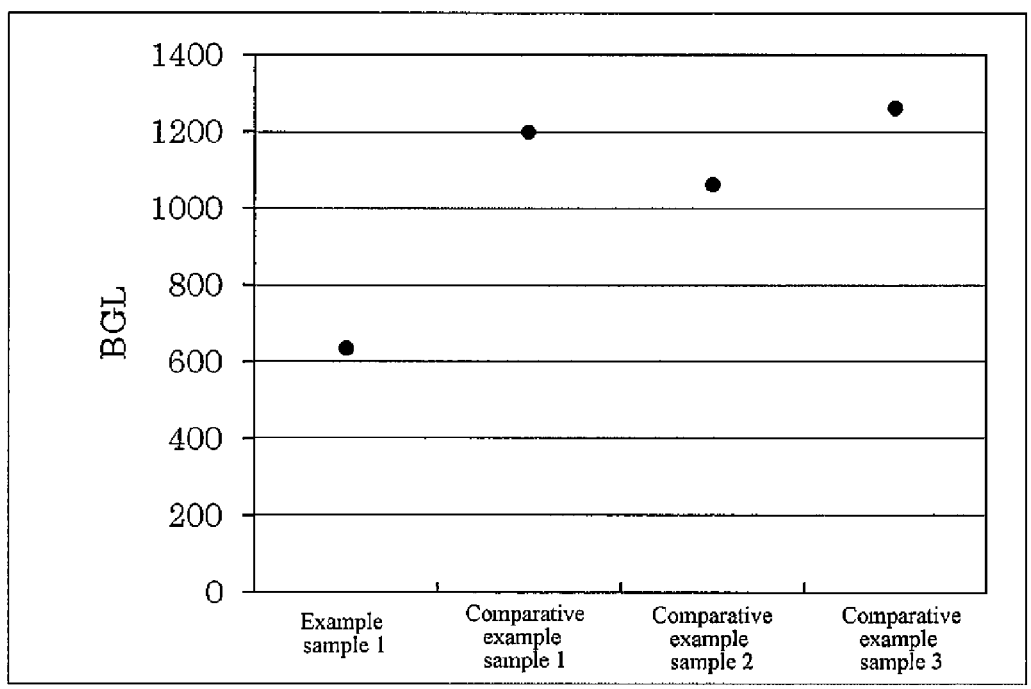
FIG. 5 is a graph showing the results of determining BGL after having carried out defect inspections using a highly sensitive defect inspection apparatus having an inspection light source wavelength of 13.5 nm on the film surface of substrates with a multilayer reflective film fabricated under various ion beam sputtering conditions in an example.

Defect inspections were carried out on the film surfaces of the substrates with a multilayer reflective film fabricated in the manner described above using a highly sensitive defect inspection apparatus having a wavelength of 13.5 nm followed by determination of BGL at that time. The results are shown in FIG. 5. According to FIG. 5, BGL can be seen to be dependent on the deposition conditions of the multilayer reflective film (Mo and Si incident angles). In addition, BGL can be seen to not be dependent on other conditions such as gas flow rate.

[Surface Roughness and Reflectance of Multilayer Reflective Film Surface]

Surface roughness (Rms) of the film surfaces of the substrates with a multilayer reflective film fabricated under the aforementioned conditions at a spatial frequency of 10 $\mu m^{-1}$ to 100 $\mu m^{-1}$ was measured with an atomic force microscope. The measured region was 1 $\mu m \times 1$ $\mu m$. The results are shown below.

Example Sample 1: Rms=0.115 nm
Comparative Example Sample 1: Rms=0.148 nm
Comparative Example Sample 2: Rms=0.132 nm
Comparative Example Sample 3: Rms=0.146 nm In addition, when reflectance of the multilayer reflective film of the aforementioned Example Sample 1 and Comparative Example Samples 1 to 3 with respect to EUV light (wavelength: 13.5 nm) was measured with the Model LPR1016 manufactured by EUV Technology Corp., in contrast to the sample having an Rms of less than 0.13 nm demonstrating high reflectance of not less than 65%, those samples having an Rms of not less than 0.13 nm demonstrated poor reflectance of less than 64%.

[Multilayer Reflective Film Deposition Conditions and Power Spectral Density (PSD)]

Figure 6:
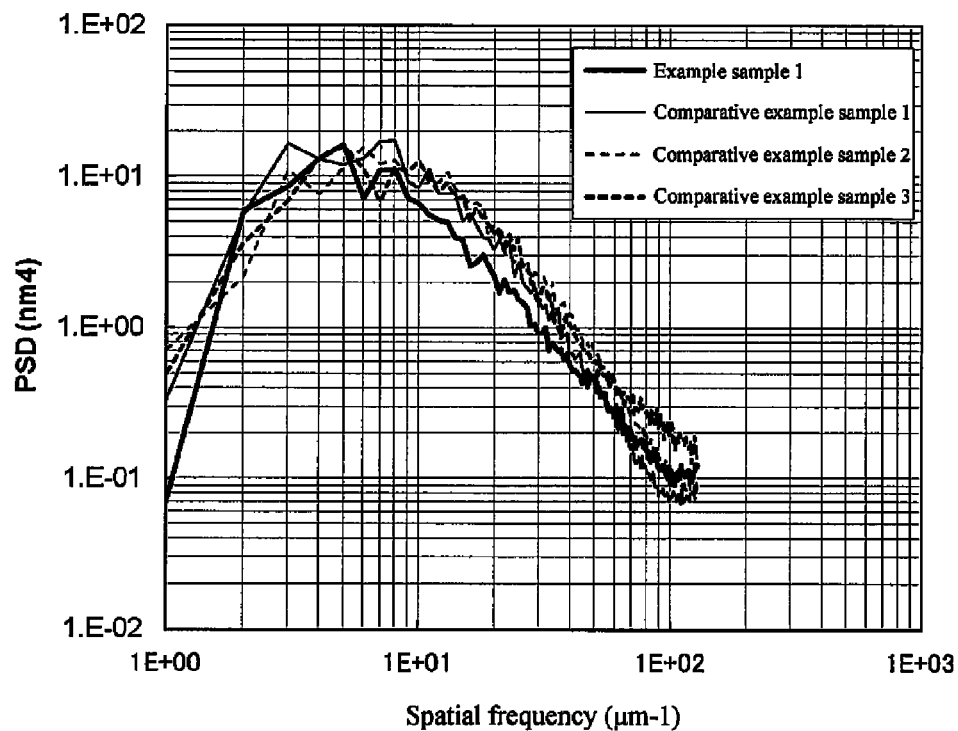
FIG. 6 is a graph showing the results of determining respective power spectral densities by measuring the film surfaces of substrates with a multilayer reflective film with an atomic force microscope (measured region: 1 μm×1 μm) in an example.

The results of analyzing power spectral density after measuring the film surfaces of the substrates with a multilayer reflective film of the aforementioned Example Sample 1 and Comparative Example Samples 1 to 3 with an atomic force microscope (measured region: 1 μm×1 μm) are shown in FIG. 6.

As can be seen in FIG. 6, the PSD at a spatial frequency of 10 μm$^{-1}$ to 100 μm$^{-1}$ of Example Sample 1, in which the sputtered particles of each layer composing the multilayer reflective films were made to enter at an angle of 0 degree to 30 degrees relative to the normal of the substrate main surface, was determined to be smaller overall in comparison with the PSD of Comparative Example Sample 1, in which the sputtered particles were made to enter at an angle of greater than 30 degrees relative to the normal of the substrate main surface. In other words, the PSD of a substrate with a multilayer reflective film at a spatial frequency of 10 μm$^{-1}$ to 100 μm$^{-1}$ was determined to be able to be held to not more than a prescribed value by suitably controlling the incident angles of Mo and Si sputtered particles relative to the normal of a glass substrate during ion beam sputtering.

On the basis of the above results, an explanation is provided of examples of the substrate with a multilayer reflective film, reflective mask blank and reflective mask of the present invention that are capable of reducing the number of detected defects, including pseudo particles, and thereby reliably detecting critical defects, in highly sensitive defect inspection apparatuses that use light of various wavelengths.

Example 1

MRF→EEM→CARE→Example Sample 1 Deposition Conditions

<Fabrication of Mask Blank Substrate>
(Surface Processing by Polishing and MRF)

An SiO$_2$—TiO$_2$-based glass substrate having a size of 152.4 mm×152.4 mm and a thickness of 6.35 mm was prepared for use as a mask blank substrate. The front and back surfaces of the glass substrate were sequentially polished with cerium oxide abrasive particles and colloidal silica abrasive particles using a double-sided polishing apparatus followed by treating the surfaces with a low concentration of hydrofluorosilicic acid. Measurement of the surface roughness of the resulting glass substrate surface with an atomic force microscope yielded a root mean square roughness (Rms) of 0.15 nm.

The surface morphology (surface form, flatness) of regions of 148 mm×148 mm on the front and back surfaces of the glass substrate was measured with a wavelength-shifting interferometer using a wavelength-modulating laser. As a result, the flatness of the front and back surfaces of the glass substrate was 290 nm (convex shape). The results of measuring the surface morphology (flatness) of the glass substrate surface were stored in a computer in the form of height information with respect to a certain reference surface for each measurement point, compared with a reference value of 50 nm (convex shape) for the surface flatness required for glass substrates and a reference value of 50 nm for the flatness of the back surface, and the differences therewith (required removal amounts) were calculated by the computer.

Next, processing conditions for topical surface processing were set corresponding to the required removal amounts for each processing spot-shaped region on the surface of the glass substrate. A spot on a dummy substrate was preliminarily processed in the same manner as actual processing without moving the substrate for a fixed period of time, the morphology thereof was measured with the same measuring instrument as the apparatus used to measure the surface morphology of the aforementioned front and back surfaces, and the processing volume of the spot was measured per unit time. The scanning speed during Raster scanning of the glass substrate was then determined in accordance with the required removal amount obtained from the spot information and surface morphology information of the glass substrate.

Surface morphology was adjusted by carrying out topical surface processing treatment in accordance with the set processing conditions by magneto rheological finishing (MRF) using a substrate finishing apparatus employing a magnetorheological fluid so that the flatness of the front and back surfaces of the glass substrate was equal to or less than the aforementioned reference values. In addition, the magnetorheological fluid used at this time contained an iron component, and the polishing slurry was composed of an alkaline aqueous solution and an abrasive (about 2% by weight) and used cerium oxide for the abrasive. Subsequently, the glass substrate was immersed in a cleaning tank containing an aqueous hydrochloric acid solution having a concentration of about 10% (temperature: about 25° C.) for about 10 minutes followed by rinsing with pure water and drying with isopropyl alcohol (IPA).

When the surface morphology (surface form, flatness) of the resulting glass substrate surface was measured, the flatness of the front and back surfaces was about 40 nm to 50 nm. In addition, when a 1 μm×1 μm region in the center of the main surface (142 mm×142 mm) on the side of the glass substrate on which a transfer pattern is formed was measured using an atomic force microscope, the surface roughness of the glass substrate surface was such that the root mean square roughness (Rms) was 0.37 nm, indicating a rougher state than the surface roughness prior to topical surface processing by MRF.

Figure 7:
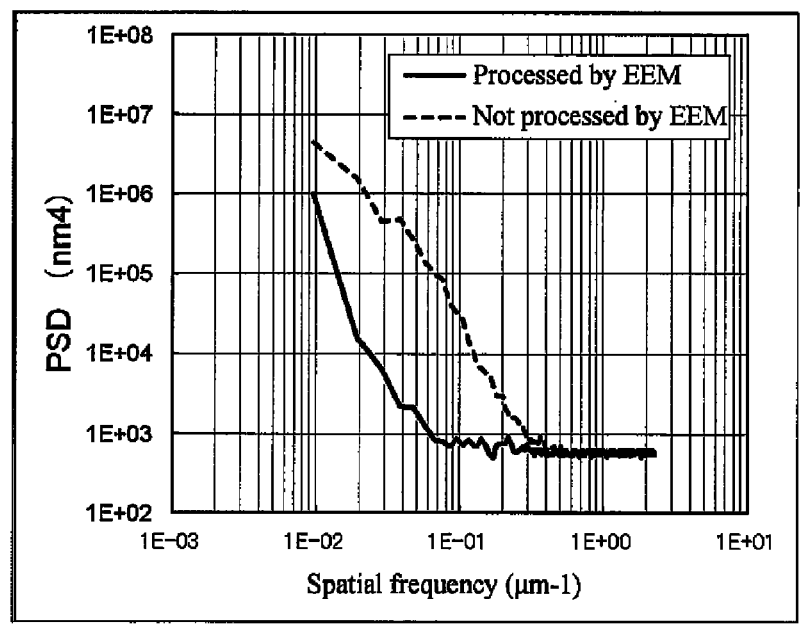
FIG. 7 is a graph showing the results of measuring power spectral densities of an EEM-processed glass substrate and unprocessed glass substrate at a magnification factor of 50× (field: 0.14 mm×0.105 mm) in an example.

A power spectral analysis was carried out by measuring the surface status of this glass substrate with the NewView 6300 Non-Contact Surface Morphology Analyzer manufactured by Zygo Corp. (measured region: 0.14 mm×0.105 mm, magnification factor: 50×). The results are shown in FIG. 7 (indicated as "Not processed by EEM"; "Processed by EEM" to be subsequently described).

As a result of power spectral analysis, power spectral density at a spatial frequency of 1×10$^{-2}$ μm$^{-1}$ to 1 μm$^{-1}$ was 4.5×10$^6$ nm$^4$ at its maximum point (spatial frequency: 1×10$^{-2}$ μm$^{-1}$) (refer to the broken line in FIG. 7).

Figure 8:
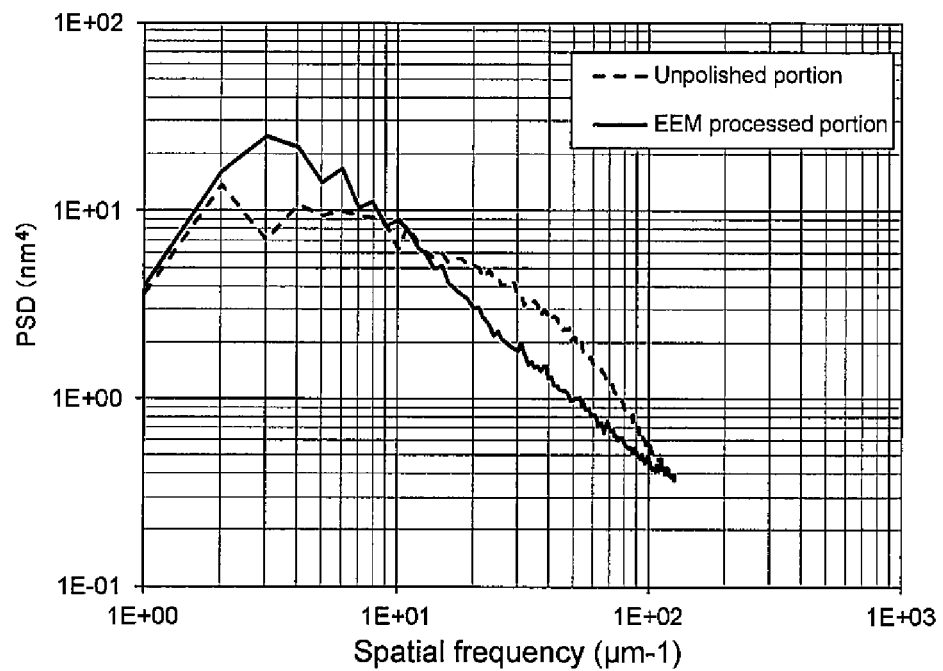
FIG. 8 is a graph showing the results of measuring power spectral densities with an atomic force microscope for a 1 μm×1 μm region of an EEM-processed glass substrate and unprocessed glass substrate in an example.

In addition, the results of analyzing power spectrum by measuring the surface roughness (measured region: 1 μm×1 μm) of the aforementioned glass substrate with an atomic force microscope are indicated in FIG. 8 as "Unpolished portion". As a result of this analysis, power spectral density at a spatial frequency of 1 μm$^{-1}$ to 100 μm$^{-1}$ was 14 nm$^4$ at its maximum point (spatial frequency: 2 μm$^{-1}$). More specifically, the power spectral density at a spatial frequency of 1 μm$^{-1}$ to 10 μm$^{-1}$ was 14 nm$^4$ at its maximum point (spatial frequency: 3 μm$^{-1}$), and power spectral density at a spatial frequency of 10 μm$^{-1}$ to 100 μm$^{-1}$ was 8.32 nm$^4$ at its maximum point (spatial frequency: 11 μm$^{-1}$) and 0.58 nm$^4$ at its minimum point (spatial frequency: 100 μm$^{-1}$) (refer to broken line in FIG. 8).

(Surface Processing by EEM)

Next, EEM was carried out on the front and back surfaces of the glass substrate that had undergone power spectral analysis as described above for the purpose of maintaining or improving the surface morphology of the glass substrate surfaces and for the purpose of reducing PSD in the intermediate spatial frequency region ($10^{-2}$ μm$^{-1}$ to 1 μm$^{-1}$). This EEM was carried out under the processing conditions indicated below.

Machining fluid: Neutral aqueous solution (pH of 7) containing fine powder particles (concentration: 3% by weight)

Fine powder particles: Colloidal silica, average particle diameter: about 80 nm

Rotating body: Polyurethane rotating sphere
Rotating body rotating speed: 280 rpm
Polishing time: 120 minutes
Load: 1.5 kg Subsequently, the edge faces of the glass substrate were scrubbed followed by megasonic cleaning with low concentration aqueous hydrofluoric acid solution (frequency: 3 MHz, 60 seconds), rinsing with pure water and drying.

Power spectral analysis was carried out by measuring the surface status of the glass substrate that had undergone surface processing by EEM with the NewView 6300 Non-Contact Surface Morphology Analyzer manufactured by Zygo Corp. (measured region: 0.14 mm×0.105 mm) in the same manner as described above. The results are shown in FIG. 7 indicated as "Processed by EEM". This magnification factor corresponds to that of the aforementioned "Not processed by EEM".

As a result of analysis, power spectral density at a spatial frequency of $1\times10^{-2}$ μm$^{-1}$ to 1 μm$^{-1}$ was $10^6$ nm$^4$ at its maximum point (spatial frequency: $1\times10^{-2}$ μm$^{-1}$). On the basis of the above, it was found that it is possible to reduce PSD in the intermediate spatial frequency region ($1\times10^{-2}$ μm$^{-1}$ to 1 μm$^{-1}$) by surface processing via EEM.

In addition, the results of carrying out power spectral analysis by measuring the surface status of the glass substrate obtained by undergoing surface processing by EEM with an atomic force microscope (measured region: 1 μm×1 μm in center of glass substrate) are shown in FIG. 8 indicated as "EEM processed portion".

As a result of analysis, power spectral density at a spatial frequency of 1 μm$^{-1}$ to 100 μm$^{-1}$ was 25 nm$^4$ at its maximum point (spatial frequency: 3 μm$^{-1}$) (see solid line in FIG. 8). More specifically, the power spectral density at a spatial frequency of 1 μm$^{-1}$ to 10 μm$^{-1}$ was 25 nm$^4$ at its maximum point (spatial frequency: 3 μm$^{-1}$), and power spectral density at a spatial frequency of 10 μm$^{-1}$ to 100 μm$^{-1}$ was 9.0 nm$^4$ at its maximum point (spatial frequency: 10 μm$^{-1}$).

On the basis of the above results shown in FIG. 8, although results were obtained that PSD at a spatial frequency of 1 μm$^{-1}$ to 10 μm$^{-1}$ did not improve (or worsened) as a result of surface processing by EEM, PSD at a spatial frequency of 10 μm$^{-1}$ to 100 μm$^{-1}$ was able to be reduced.

Figure 10:
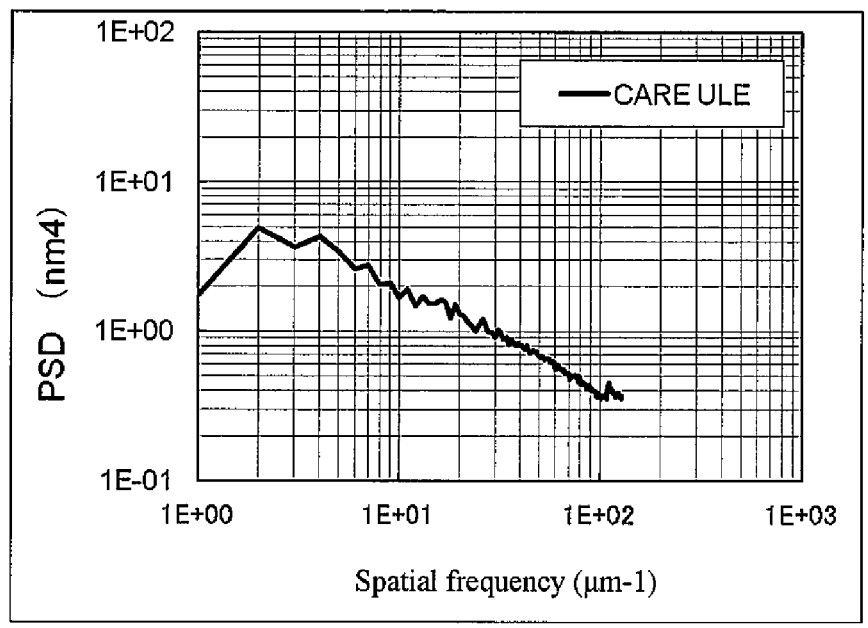
FIG. 10 is a graph showing the results of measuring power spectral density with an atomic force microscope for a 1 μm×1 μm region of a mask blank substrate that had undergone EEM processing and CARE processing in an example.

(2) CARE and PSD (FIG. 10)

Figure 9:
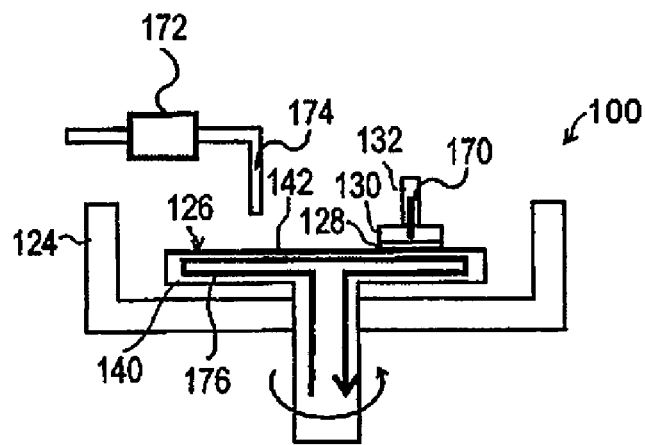
FIG. 9 is a schematic diagram of a typical CARE processing apparatus.

Next, surface processing by catalyst-referred etching (CARE) was carried out on one side at a time of the front and back surfaces of the glass substrate that had undergone EEM surface processing as described above using the CARE processing apparatus shown in FIG. 9 for the purpose of reducing PSD in the high spatial frequency region (not less than 1 μm$^{-1}$). In addition, the processing conditions were as indicated below.

Machining fluid: Pure water
Catalyst: Pt
Substrate rotating speed: 10.3 rpm
Catalyst surface plate rotating speed: 10 rpm
Processing time: 50 minutes
Processing pressure: 250 hPa Subsequently, after scrubbing the edge faces of the glass substrate, the substrate was immersed in a cleaning tank containing aqua regia (temperature: about 65° C.) followed by rinsing with pure water and drying. In addition, cleaning with aqua regia was carried out several times until there was no longer any Pt catalyst residue on the front and back surfaces of the glass substrate.

The results of carrying out power spectral analysis by measuring the surface status of the glass substrate that underwent surface processing by CARE with an atomic force microscope (measured region: 1 μm×1 μm) are shown in FIG. 10. As a result of analysis, power spectral density at a spatial frequency of 1 μm$^{-1}$ to 100 μm$^{-1}$ was 5.0 nm$^4$ at its maximum point (spatial frequency: 2 μm$^{-1}$). More specifically, the power spectral density at a spatial frequency of 1 μm$^{-1}$ to 10 μm$^{-1}$ was 5.0 nm$^4$ at its maximum point (spatial frequency: 2 μm$^{-1}$), and power spectral density at a spatial frequency of 10 μm$^{-1}$ to 100 μm$^{-1}$ was 1.9 nm$^4$ at its maximum point (spatial frequency: 11 μm$^{-1}$).

On the basis of these results, surface processing by CARE was able to reduce roughness in the high spatial frequency region. In addition, root mean square roughness (Rms) at a spatial frequency of 10 μm$^{-1}$ to 100 μm$^{-1}$ was favorable at 0.08 nm.

<Fabrication of Substrate with a Multilayer Reflective Film>

Next, a multilayer reflective film was deposited on a mask blank substrate obtained in this manner under the deposition conditions of the aforementioned Example Sample 1, and an Ru protective film was further deposited on the multilayer reflective film by RF sputtering to fabricate a substrate with a multilayer reflective film.

Power spectral analysis was carried out after measuring the protective film surface of the resulting substrate with a multilayer reflective film with an atomic force microscope (measured region: 1 μm×1 μm). As a result, power spectral density at a spatial frequency of 1 μm$^{-1}$ to 10 μm$^{-1}$ was 15.8 nm$^4$ at its maximum point (spatial frequency: 5 μm$^{-1}$), and power spectral density at a spatial frequency of 10 μm$^{-1}$ to 100 μm$^{-1}$ was 6.73 nm$^4$ at its maximum point (spatial frequency: 10 μm$^{-1}$). In addition, Rms at a spatial frequency of 10 μm$^{-1}$ to 100 μm$^{-1}$ was 0.126 nm. Further, measurement of the reflectance of this protective film surface with the Model LPR1016 manufactured by EUV Technology Corp. yielded a high reflectance of 65.1%.

Next, defect inspections were carried out using a highly sensitive defect inspection apparatus having an inspection light source wavelength of 193 nm (Teron 600 Series manufactured by KLA-Tencor Corp.) and a highly sensitive defect inspection apparatus having an inspection light source wavelength of 13.5 nm. In addition, the size of the measured region was 132 mm×132 mm. Inspection sensitivity conditions were set to allow detection of defects having a size of 20 nm in terms of the sphere equivalent volume diameter (SEVD). Incidentally, SEVD can be calculated according to the equation: SEVD=$2(3S/4\pi H)^{1/3}$ when defining (S) to be the area of the defect when viewed overhead and defining (h) to be the defect height (to apply similarly in the subsequent examples and comparative example). Defect area (S) and defect height (h) can be measured with an atomic force microscope (AFM). As a result, the number of defects detected by the Teron 610 was 21,705, and BGL did not exceed the threshold value even in inspection by Actinic, the number of detected defects, including pseudo defects, was small, and it was easy to inspect for defects. If the number of defects detected by the Teron 610 is equal to or less than 100,000 and the number of defects, including pseudo defects, detected in inspection by Actinic is small, the presence of contaminants, scratches and other critical defects can be easily inspected.

<Fabrication of Reflective Mask Blank>

Next, fiducial marks were formed with a focused ion beam at four locations outside the transfer pattern forming region on the protective film and multilayer reflective film of a substrate with a multilayer reflective film in order to control the coordinates of the locations of the aforementioned defects.

Next, a back side electrically conductive film was formed on the back surface of the substrate with a multilayer reflective film on which a multilayer reflective film was not formed by DC magnetron sputtering. The back side electrically conductive film was formed by positioning a Cr target in opposition to the back surface of the substrate with a multilayer reflective film and carrying out reactive sputtering in an atmosphere of a mixture of Ar and $N_2$ gas ($Ar:N_2=90\%:10\%$). Furthermore, the film thickness of the back side electrically conductive film was 20 nm.

Moreover, an absorber film composed of TaBN was deposited on the protective film surface of the aforementioned substrate with a multilayer reflective film by DC magnetron sputtering to fabricate a reflective mask blank. This absorber film was formed by positioning a TaB target (Ta:B=80:20) in opposition to the substrate with a multilayer reflective film and carrying out reactive sputtering in an atmosphere of a mixture of Xe and $N_2$ gas ($Xe:N_2=90\%:10\%$). In addition, the film thickness of the absorber film was 70 nm. Furthermore, the crystal structure of the absorber film was determined to be an amorphous structure when measured with an X-ray diffraction device (XRD).

<Fabrication of Reflective Mask>

A resist was coated onto the surface of the aforementioned absorber film by spin coating followed by going through heating and cooling steps to fabricate a resist film having a film thickness of 150 nm. Next, a resist pattern was formed by going through drawing step of a desired pattern and development step. The absorber film in the form of a TaBN film was then patterned by using this resist pattern as a mask and dry etching with a mixture of $Cl_2$ and He gas to form an absorber pattern on the protective film. Subsequently, the resist film was removed followed by cleaning to fabricate a reflective mask.

In addition, in the aforementioned drawing step, the reflective mask was fabricated by correcting drawing data based on the aforementioned fiducial marks so that the absorber pattern was arranged at those locations where critical defects were present. The resulting reflective mask was confirmed to be free of defects when inspected for defects using a highly sensitive defect inspection apparatus having an inspection light source wavelength of 193 nm (Teron 600 Series manufactured by KLA-Tencor Corp.).

As has been previously described, since the reflective mask was confirmed to be free of defects when inspected with a highly sensitive defect inspection apparatus, in the case of carrying out a lithography process that uses an exposure apparatus while using this reflective mask, a semiconductor device can be fabricated without the occurrence of transfer pattern defects attributable to the reflective mask.

Example 2

MRF and EEM processing were carried out in the same manner as in Example 1 using the same glass substrate as that used in Example 1. In addition, EEM processing conditions were as indicated below.

Machining fluid: Neutral aqueous solution (pH of 7) containing fine powder particles (concentration: 5% by weight)

Fine powder particles: Colloidal silica, average particle diameter: about 80 nm

Rotating body: Polyurethane rotating sphere

Rotating body rotating speed: 280 rpm

Polishing time: 120 minutes

Load: 1.5 kg

A multilayer reflective film was deposited on the mask blank substrate obtained in this manner under the deposition conditions used in the aforementioned Example Sample 1 followed by further depositing an Ru protective film (film thickness: 2.5 nm) on the multilayer reflective film by RF sputtering to fabricate a substrate with a multilayer reflective film.

Power spectral analysis was carried out after measuring the protective film surface of the resulting substrate with a multilayer reflective film with an atomic force microscope (measured region: 1 μm×1 μm). As a result, power spectral density at a spatial frequency of 1 $\mu m^{-1}$ to 10 $\mu m^{-1}$ was 17.2 $nm^4$ at its maximum point (spatial frequency: 5.4 $\mu m^{-1}$), and power spectral density at a spatial frequency of 10 $\mu m^{-1}$ to 100 $\mu m^{-1}$ was 7.18 $nm^4$ at its maximum point (spatial frequency: 10 $\mu m^{-1}$). In addition, Rms at a spatial frequency of 10 $\mu m^{-1}$ to 100 $\mu m^{-1}$ was 0.123 nm. Measurement of the reflectance of this protective film surface with the Model LPR1016 manufactured by EUV Technology Corp. yielded a high reflectance of 65.2%.

Next, defect inspections were carried out using a highly sensitive defect inspection apparatus having an inspection light source wavelength of 193 nm (Teron 600 Series manufactured by KLA-Tencor Corp.) and a highly sensitive defect inspection apparatus having an inspection light source wavelength of 13.5 nm. In addition, the size of the measured region was 132 mm×132 mm. Inspection sensitivity conditions were set to allow detection of defects having a size of 20 nm in terms of the sphere equivalent volume diameter (SEVD). As a result, the number of defects detected by the Teron 610 was 28,591, BGL did not exceed the threshold value even in inspection by Actinic, the number of detected defects, including pseudo defects, was small, and it was easy to inspect for defects. Lower number of pseudo defects facilitates inspection of the presence of contaminants, scratches and other critical defects.

In addition, a reflective mask blank and a reflective mask were fabricated in the same manner as in the aforementioned Example 1. The resulting reflective mask was confirmed to be free of defects when inspected for defects using a highly sensitive defect inspection apparatus having an inspection light source wavelength of 193 nm (Teron 600 Series manufactured by KLA-Tencor Corp.).

Reference Example 1

An $SiO_2$—$TiO_2$-based glass substrate having a size of 152.4 mm×152.4 mm and a thickness of 6.35 mm was prepared for use as a glass substrate, and MRF and EEM processing were carried out in the same manner as in Example 1. In addition, EEM processing conditions were as indicated below.

Machining fluid: Neutral aqueous solution (pH of 7) containing fine powder particles (concentration: 5% by weight)

Fine powder particles: Colloidal silica, average particle diameter: about 80 nm
Rotating body: Polyurethane roll
Rotating body rotating speed: 280 rpm
Polishing time: 180 minutes A multilayer reflective film was deposited on the mask blank substrate fabricated in this manner under the deposition conditions used in the aforementioned Comparative Example Sample 2 followed by further depositing an Ru protective film (film thickness: 2.5 nm) on the multilayer reflective film by RF sputtering to fabricate a substrate with a multilayer reflective film.

Power spectral analysis was carried out after measuring the protective film surface of the resulting substrate with a multilayer reflective film with an atomic force microscope (measured region: 1 μm×1 μm). As a result, power spectral density at a spatial frequency of 1 $\mu m^{-1}$ to 10 $\mu m^{-1}$ was 18.1 $nm^4$ at its maximum point (spatial frequency: 4.8 $\mu m^{-1}$), and power spectral density at a spatial frequency of 10 $\mu m^{-1}$ to 100 $\mu m^{-1}$ was 9.6 $nm^4$ at its maximum point (spatial frequency: 10 $\mu m^{-1}$). In addition, Rms at a spatial frequency of 10 $\mu m^{-1}$ to 100 $\mu m^{-1}$ was 0.151 nm. Measurement of the reflectance of this protective film surface with the Model LPR1016 manufactured by EUV Technology Corp. yielded a value of 64.4%.

Next, defect inspections were carried out using a highly sensitive defect inspection apparatus having an inspection light source wavelength of 193 nm (Teron 600 Series manufactured by KLA-Tencor Corp.) and a highly sensitive defect inspection apparatus having an inspection light source wavelength of 13.5 nm. In addition, the size of the measured region was 132 mm×132 mm. Inspection sensitivity conditions were set to allow detection of defects having a size of 20 nm in terms of the sphere equivalent volume diameter (SEVD). As a result, the number of defects detected by the Teron 610 was 34,017, BGL exceeded the threshold value in inspection by Actinic inspection apparatus, the number of detected defects, including pseudo defects, was as large as 100,000, and it was difficult to inspect for defects.

Example 3

A substrate with a multilayer reflective film was fabricated in the same manner as in Example 1 with the exception of fabricating the mask blank substrate without carrying out the EEM and CARE of the aforementioned Example 1, and instead carrying out double-sided touch polishing.

Power spectral analysis was carried out after measuring the protective film surface of the resulting substrate with a multilayer reflective film with an atomic force microscope (measured region: 1 μm×1 μm). As a result, power spectral density at a spatial frequency of 1 $\mu m^{-1}$ to 10 $\mu m^{-1}$ was 18.5 $nm^4$ at its maximum point (spatial frequency: 4.5 $\mu m^{-1}$), and power spectral density at a spatial frequency of 10 $\mu m^{-1}$ to 100 $\mu m^{-1}$ was 8.8 $nm^4$ at its maximum point (spatial frequency: 10 $\mu m^{-1}$). In addition, Rms at a spatial frequency of 10 $\mu m^{-1}$ to 100 $\mu m^{-1}$ was 0.129 nm. Measurement of the reflectance of this protective film surface with the Model LPR1016 manufactured by EUV Technology Corp. yielded a high reflectance of 65.0%.

Next, defect inspections were carried out using a highly sensitive defect inspection apparatus having an inspection light source wavelength of 193 nm (Teron 600 Series manufactured by KLA-Tencor Corp.) and a highly sensitive defect inspection apparatus having an inspection light source wavelength of 13.5 nm. In addition, the size of the measured region was 132 mm×132 mm. Inspection sensitivity conditions were set to allow detection of defects having a size of 20 nm in terms of the sphere equivalent volume diameter (SEVD). As a result, the number of defects detected by the Teron 610 was 40,028, BGL did not exceed the threshold value even in inspection by Actinic inspection apparatus, and inspections were able to be carried out with a low number of detected defects, including pseudo defects.

Example 4

MRF and CARE processing were carried out in the same manner as in Example 1 using the same glass substrate as that used in Example 1. In addition, CARE processing conditions were as indicated below.
Machining fluid: Pure water
Catalyst: Cr
Substrate rotating speed: 10.3 rpm
Catalyst surface plate rotating speed: 10 rpm
Processing time: 20 minutes
Processing pressure: 50 hPa Subsequently, after scrubbing the edge faces of the glass substrate, the substrate was immersed in a cleaning tank containing Cr etching solution containing cerium diammonium nitrate and perchloric acid followed by rinsing with pure water and drying. In addition, cleaning with Cr etching solution was carried out several times until there was no longer any Cr catalyst residue on the front and back surfaces of the glass substrate.

A multilayer reflective film was deposited on the mask blank substrate obtained in this manner under the deposition conditions used in the aforementioned Example Sample 1 followed by further depositing an Ru protective film (film thickness: 2.5 nm) on the multilayer reflective film by ion beam sputtering to fabricate a substrate with a multilayer reflective film.

Power spectral analysis was carried out after measuring the protective film surface of the resulting substrate with a multilayer reflective film with an atomic force microscope (measured region: 1 μm×1 μm). As a result, power spectral density at a spatial frequency of 1 $\mu m^{-1}$ to 10 $\mu m^{-1}$ was 16.4 $nm^4$ at its maximum point (spatial frequency: 3 $\mu m^{-1}$), and power spectral density at a spatial frequency of 10 $\mu m^{-1}$ to 100 $\mu m^{-1}$ was 6.4 $nm^4$ at its maximum point (spatial frequency: 10 $\mu m^{-1}$). In addition, Rms at a spatial frequency of 10 $\mu m^{-1}$ to 100 $\mu m^{-1}$ was 0.119 nm. Measurement of the reflectance of this protective film surface with the Model LPR1016 manufactured by EUV Technology Corp. yielded a high reflectance of 66.2%.

Next, defect inspections were carried out using a highly sensitive defect inspection apparatus having an inspection light source wavelength of 193 nm (Teron 600 Series manufactured by KLA-Tencor Corp.) and a highly sensitive defect inspection apparatus having an inspection light source wavelength of 13.5 nm. In addition, the size of the measured region was 132 mm×132 mm. Inspection sensitivity conditions were set to allow detection of defects having a size of 20 nm in terms of the sphere equivalent volume diameter (SEVD). As a result, the number of defects detected by the Teron 610 was 23,450, BGL did not exceed the threshold value even in Actinic inspection, the number of detected defects, including pseudo defects, was small, and it was easy to inspect for defects. Lower number of pseudo defects facilitates inspection of the presence of contaminants, scratches and other critical defects.

In addition, a reflective mask blank and a reflective mask were fabricated in the same manner as in the aforementioned Example 1. The resulting reflective mask was confirmed to be free of defects when inspected for defects using a highly sensitive defect inspection apparatus having an inspection light source wavelength of 193 nm (Teron 600 Series manufactured by KLA-Tencor Corp.).

Comparative Example 1

A substrate with a multilayer reflective film was fabricated in the same manner as in Reference Example 1 with the exception of not carrying out the EEM of the aforementioned Reference Example 1 and instead carrying out double-sided touch polishing.

Power spectral analysis was carried out after measuring the protective film surface of the resulting substrate with a multilayer reflective film with an atomic force microscope (measured region: 1 μm×1 μm). As a result, power spectral density at a spatial frequency of 1 $\mu m^{-1}$ to 10 $\mu m^{-1}$ was 25 $nm^4$ at its maximum point (spatial frequency: 3.5 $\mu m^{-1}$), and power spectral density at a spatial frequency of 10 $\mu m^{-1}$ to 100 $\mu m^{-1}$ was 10.5 $nm^4$ at its maximum point (spatial frequency: 10 $\mu m^{-1}$). In addition, Rms at a spatial frequency of 10 $\mu m^{-1}$ to 100 $\mu m^{-1}$ was 0.147 nm. Measurement of the reflectance of this protective film surface with the Model LPR1016 manufactured by EUV Technology Corp. yielded a value of 64.8%.

Next, defect inspections were carried out using a highly sensitive defect inspection apparatus having an inspection light source wavelength of 193 nm (Teron 600 Series manufactured by KLA-Tencor Corp.) and a highly sensitive defect inspection apparatus having an inspection light source wavelength of 13.5 nm. In addition, the size of the measured region was 132 mm×132 mm. Inspection sensitivity conditions were set to allow detection of defects having a size of 20 nm in terms of the sphere equivalent volume diameter (SEVD). As a result, the number of defects detected by the Teron 610 was in excess of 100,000, BGL exceeded the threshold value in inspection by Actinic, and the number of detected defects, including pseudo defects, was as large as 100,000.

In addition, as indicated in the aforementioned examples, a substrate with a multilayer reflective film, reflective mask blank and reflective mask respectively manufactured according to the method of manufacturing a substrate with a multilayer reflective film, method of manufacturing a reflective mask blank and method of manufacturing a reflective mask as indicated below are also able to demonstrate the effects of the present invention.

(Configuration A)

A method of manufacturing a substrate with a multilayer reflective film having a multilayer reflective film, obtained by alternately laminating a high refractive index layer and a low refractive index layer on the main surface of a mask blank substrate on the side of which a transfer pattern is formed; wherein, the mask blank substrate is subjected to surface processing by EEM and/or catalyst-referred etching, and the multilayer reflective film is deposited on the main surface by making sputtered particles of a high refractive index material and a low refractive index material enter at an incident angle of 0 degree to 30 degrees relative to the normal of the main surface by ion beam sputtering using targets composed of the high refractive index material and the low refractive index material.

(Configuration B)

The method of manufacturing a substrate with a multilayer reflective film described in Configuration A, wherein the mask blank substrate is composed of a glass material.

(Configuration C)

The method of manufacturing a substrate with a multilayer reflective film described in Configuration A or Configuration B, wherein the catalyst-referred etching removes decomposition products of hydrolysis from the main surface by allowing a catalyst composed of a material containing a transition metal to contact, or be in extremely close proximity to, the main surface with a treatment liquid interposed therebetween while allowing the catalyst and the main surface to undergo relative motion.

(Configuration D)

The method of manufacturing a substrate with a multilayer reflective film described in Configuration C, wherein the treatment liquid is water or pure water.

(Configuration E)

The method of manufacturing a substrate with a multilayer reflective film described in any of Configuration A to Configuration D, wherein a protective film is further formed on the multilayer reflective film.

(Configuration F)

A method of manufacturing a reflective mask blank, comprising: forming an absorber film serving as a transfer pattern on the multilayer reflective film or protective film of the substrate with a multilayer reflective film manufactured according to the method of manufacturing a substrate with a multilayer reflective film described in any of Configurations A to E.

(Configuration G)

A method of manufacturing a reflective mask, comprising: forming an absorber pattern on the multilayer reflective film or the protective film by patterning the absorber film in a reflective mask blank manufactured according to the method of manufacturing a reflective mask blank described in Configuration F.

BRIEF DESCRIPTION OF THE REFERENCE SYMBOLS

10 Mask blank substrate
20 Substrate with a multilayer reflective film
21 Multilayer reflective film
22 Protective film
23 Back side electrically conductive film
24 Absorber film
27 Absorber pattern
30 Reflective mask blank
40 Reflective mask
100 Catalyst-referred etching (CARE) processing device
124 Treatment tank
126 Catalyst surface plate
128 Processing target
130 Substrate holder
132 Rotating shaft
140 Base
142 Platinum (catalyst)
170 Heater
172 Heat exchanger
174 Treatment liquid supply nozzle
176 Liquid flow path

The invention claimed is:

1. A method of manufacturing a substrate with a multilayer reflective film having a multilayer reflective film, obtained by alternately laminating a high refractive index layer and a low refractive index layer, on the main surface of a mask blank substrate on the side of which a transfer pattern is formed, comprising a step of:

depositing the multilayer reflective film on the main surface by ion beam sputtering using targets composed of a high refractive index material and a low refractive index material; wherein, during the ion beam sputtering, sputtered particles of the high refractive index material and the low refractive index material are made to enter at prescribed incident angle relative to the normal of the main surface so that the power spectral density at a spatial frequency of 1 $\mu m^{-1}$ to 10 $\mu m^{-1}$, obtained by measuring a 1 $\mu m \times 1$ $\mu m$ region on the surface of the multilayer reflective film with an atomic force microscope, is not more than 20 $nm^4$, and power spectral density at a spatial frequency of 10 $\mu m^{-1}$ to 100 $\mu m^{-1}$ is not more than 10 $nm^4$.

2. The method of manufacturing a substrate with a multilayer reflective film according to claim 1, wherein the incident angle is 0 degree to 30 degrees relative to the normal of the main surface.

3. The method of manufacturing a substrate with a multilayer reflective film according to claim 1, further comprising a step of forming a protective film on the multilayer reflective film, wherein the power spectral density at a spatial frequency of 1 $\mu m^{-1}$ to 10 $\mu m^{-1}$, obtained by measuring a 1 $\mu m \times 1$ $\mu m$ region on the surface of the protective film with an atomic force microscope, is not more than 20 $nm^4$, and power spectral density at a spatial frequency of 10 $\mu m^{-1}$ to 100 $\mu m^{-1}$ is not more than 10 $nm^4$.

4. A method of manufacturing a reflective mask blank, comprising: forming an absorber film to serve as a transfer pattern on a protective film of a substrate with a multilayer reflective film manufactured according to the method of manufacturing a substrate with a multilayer reflective film according to claim 3.

5. A method of manufacturing a reflective mask, comprising: forming an absorber pattern on the protective film by patterning an absorber film in a reflective mask blank manufactured according to the method of manufacturing a reflective mask blank according to claim 4.

6. The method of manufacturing a substrate with a multilayer reflective film according to claim 1, wherein the power spectral density at a spatial frequency of 1 $\mu m^{-1}$ to 10 $\mu m^{-1}$, obtained by measuring a 1 $\mu m \times 1$ $\mu m$ region on the main surface of the mask blank substrate on the side of which the transfer pattern is formed with an atomic force microscope, is not more than 10 $nm^4$.

7. The method of manufacturing a substrate with a multilayer reflective film according to claim 6, wherein the surface of the mask blank substrate is processed by elastic emission machining (EEM) and/or catalyst-referred etching (CARE).

8. A method of manufacturing a reflective mask blank, comprising: forming an absorber film to serve as a transfer pattern on a multilayer reflective film of a substrate with a multilayer reflective film manufactured according to the method of manufacturing a substrate with a multilayer reflective film according to claim 1.

9. A method of manufacturing a reflective mask, comprising: forming an absorber pattern on the multilayer reflective film by patterning an absorber film in a reflective mask blank manufactured according to the method of manufacturing a reflective mask blank according to claim 8.

10. A substrate with a multilayer reflective film having a multilayer reflective film, obtained by alternately laminating a high refractive index layer and a low refractive index layer, on the main surface of a mask blank substrate on the side of which a transfer pattern is formed; wherein, the film surface of the substrate with a multilayer reflective film is such that the power spectral density at a spatial frequency of 1 $\mu m^{-1}$ to 10 $\mu m^{-1}$, obtained by measuring a 1 $\mu m \times 1$ $\mu m$ region with an atomic force microscope, is not more than 20 $nm^4$, power spectral density at a spatial frequency of 10 $\mu m^{-1}$ to 100 $\mu m^{-1}$ is not more than 10 $nm^4$, and surface roughness of the film surface at a spatial frequency of 10 $\mu m^{-1}$ to 100 $\mu m^{-1}$ is less than 0.13 nm in terms of the root mean square roughness (Rms).

11. The substrate with a multilayer reflective film according to claim 10, wherein the substrate with a multilayer reflective film has a protective film on the multilayer reflective film, the power spectral density at a spatial frequency of 1 $\mu m^{-1}$ to 10 $\mu m^{-1}$, obtained by measuring a 1 $\mu m \times 1$ $\mu m$ region of the protective film surface with an atomic force microscope, is not more than 20 $nm^4$, power spectral density at a spatial frequency of 10 $\mu m^{-1}$ to 100 $\mu m^{-1}$ is not more than 10 $nm^4$, and surface roughness of the protective film surface at a spatial frequency of 10 $\mu m^{-1}$ to 100 $\mu m^{-1}$ is less than 0.13 nm in terms of the root mean square roughness (Rms).

12. A reflective mask blank having an absorber film to serve as a transfer pattern on a protective film of the substrate with a multilayer reflective film according to claim 11.

13. A reflective mask having an absorber pattern on the protective film that is obtained by patterning an absorber film in the reflective mask blank according to claim 12.

14. A method of manufacturing a semiconductor device, comprising a step of forming a transfer pattern on a workpiece by carrying out a lithography process that uses an exposure apparatus using the reflective mask according to claim 13.

15. A reflective mask blank having an absorber film to serve as a transfer pattern on a multilayer reflective film of the substrate with a multilayer reflective film according to claim 10.

16. A reflective mask having an absorber pattern on the multilayer reflective film that is obtained by patterning an absorber film in the reflective mask blank according to claim 15.

17. A method of manufacturing a semiconductor device, comprising a step of forming a transfer pattern on a workpiece by carrying out a lithography process that uses an exposure apparatus using the reflective mask according to claim 16.

* * * * *